(12) United States Patent
Kim

(10) Patent No.: US 12,389,782 B2
(45) Date of Patent: Aug. 12, 2025

(54) ELECTROLUMINESCENT DISPLAY DEVICE

(71) Applicant: LG DISPLAY CO., LTD., Seoul (KR)

(72) Inventor: Byungjin Kim, Paju-si (KR)

(73) Assignee: LG Display Co., Ltd. (KR)

( * ) Notice: Subject to any disclaimer, the term of this patent is extended or adjusted under 35 U.S.C. 154(b) by 339 days.

(21) Appl. No.: 17/875,706

(22) Filed: Jul. 28, 2022

(65) Prior Publication Data

US 2023/0077098 A1 Mar. 9, 2023

(30) Foreign Application Priority Data

Sep. 3, 2021 (KR) .................. 10-2021-0117626
Dec. 15, 2021 (KR) .................. 10-2021-0179859

(51) Int. Cl.
| | |
|---|---|
| *H10K 50/844* | (2023.01) |
| *H10D 30/67* | (2025.01) |
| *H10D 86/40* | (2025.01) |
| *H10D 86/60* | (2025.01) |
| *H10K 50/84* | (2023.01) |

(Continued)

(52) U.S. Cl.
CPC ......... *H10K 50/844* (2023.02); *H10K 50/846* (2023.02); *H10K 59/1213* (2023.02); *H10K 59/122* (2023.02); *H10K 59/124* (2023.02); *H10K 59/126* (2023.02); *H10K 59/1315* (2023.02); *H10D 30/6723* (2025.01);
(Continued)

(58) Field of Classification Search
CPC .. H10K 50/846; H10K 50/844; H10K 59/873; H10K 59/1315; H10K 59/122; H10K 59/124; H10K 59/126; H10K 59/1213
See application file for complete search history.

(56) References Cited

U.S. PATENT DOCUMENTS

| | | | |
|---|---|---|---|
| 2013/0194224 A1* | 8/2013 | Lai ................. | G06F 3/0412 345/174 |
| 2021/0091320 A1* | 3/2021 | Choi ............... | H10K 59/131 |
| 2022/0209179 A1* | 6/2022 | Jeon ............... | H10K 59/131 |

FOREIGN PATENT DOCUMENTS

| | | |
|---|---|---|
| KR | 2016-0054867 A | 5/2016 |
| KR | 20200036130 A | 4/2020 |

(Continued)

OTHER PUBLICATIONS

Office Action in Korean Appln. No. 10-2021-0179859, dated Jul. 2, 2025, 29 pages (with machine English translation).

*Primary Examiner* — Vongsavanh Sengdara
(74) *Attorney, Agent, or Firm* — Fish & Richardson P.C.

(57) ABSTRACT

An electroluminescent display device includes a substrate including a display area and a non-display area including a gate-in-panel (GIP) area disposed outside the display area, an oxide thin-film transistor disposed above the substrate, a planarization layer disposed above the oxide thin-film transistor, an anode disposed above the planarization layer, a bank disposed above the planarization layer and including an opening portion through which a part of the anode is exposed, a plurality of dams disposed outside the GIP area and configured by the planarization layer and the bank, a buffer layer disposed above the bank and the dam and made of silicon nitride, a light-emitting part disposed on the exposed anode and the buffer layer, and a cathode disposed on the light-emitting part, thereby inhibiting hydrogen from entering an oxide thin-film transistor and improve properties and reliability of the transistor.

26 Claims, 17 Drawing Sheets

(51) Int. Cl.
  *H10K 59/121* (2023.01)
  *H10K 59/122* (2023.01)
  *H10K 59/124* (2023.01)
  *H10K 59/126* (2023.01)
  *H10K 59/131* (2023.01)

(52) U.S. Cl.
  CPC ....... *H10D 30/6755* (2025.01); *H10D 86/423* (2025.01); *H10D 86/60* (2025.01)

(56) References Cited

FOREIGN PATENT DOCUMENTS

| KR | 2020-0073544 A | 6/2020 |
| KR | 20200063377 A | 6/2020 |
| KR | 2020-0082764 A | 7/2020 |
| KR | 20210035959 A | 4/2021 |

\* cited by examiner

ELECTROLUMINESCENT DISPLAY DEVICE

CROSS-REFERENCE TO RELATED APPLICATIONS

This application claims the priorities of Korean Patent Application No. 10-2021-0117626 filed on Sep. 3, 2021 and Korean Patent Application No. 10-2021-0179859 filed on Dec. 15, 2021, which are hereby incorporated by reference in their entirety.

BACKGROUND

Field of the Disclosure

The present disclosure relates to an electroluminescent display device, and more particularly, to an electroluminescent display device using an oxide thin-film transistor.

Description of the Background

Recently, display devices, which visually display electrical information signals, are being rapidly developed in accordance with the full-fledged entry into the information era. Various studies are being continuously conducted to develop a variety of display devices which are thin and lightweight, consume low power, and have improved performance.

As the representative display devices, there are a liquid crystal display device (LCD), an electrowetting display device (EWD), an organic light-emitting display device (OLED), and the like.

Among the display devices, an electroluminescent display device including the organic light-emitting display device refers to a display device that autonomously emits light. Unlike a liquid crystal display device, the electroluminescent display device does not require a separate light source and thus may be manufactured as a lightweight, thin display device. In addition, the electroluminescent display device is advantageous in terms of power consumption because the electroluminescent display device operates at a low voltage. Further, the electroluminescent display device is expected to be adopted in various fields because the electroluminescent display device is also excellent in implementation of colors, response speeds, viewing angles, and contrast ratios (CRs).

The electroluminescent display device is configured such that a light-emitting layer made of an organic material is disposed between two electrodes called an anode and a cathode. Further, when positive holes are injected into the light-emitting layer from the anode and electrons are injected into the light-emitting layer from the cathode, the injected electrons and positive holes are recombined and produce excitons in a light-emitting layer.

SUMMARY

Accordingly, the present disclosure is to provide an electroluminescent display device using an oxide thin-film transistor, which is capable of suppressing penetration of outside moisture and inhibiting an overflow of a particle blocking layer.

The present disclosure is not limited to the above-mentioned and other features, which are not mentioned above, can be clearly understood by those skilled in the art from the following descriptions.

According to an aspect of the present disclosure, an electroluminescent display device includes a substrate including a display area and a non-display area including a gate-in-panel (GIP) area disposed outside the display area, an oxide thin-film transistor disposed above the substrate, a planarization layer disposed above the oxide thin-film transistor, an anode disposed above the planarization layer, a bank disposed above the planarization layer and including an opening portion through which a part of the anode is exposed, a plurality of dams disposed outside the GIP area and configured by the planarization layer and the bank, a buffer layer disposed above the bank and the dam and made of silicon nitride, a light-emitting part disposed on the exposed anode and the buffer layer and a cathode disposed on the light-emitting part.

According to another aspect of the present disclosure, an electroluminescent display device includes, a substrate including a display area and a non-display area disposed outside the display area, an oxide thin-film transistor disposed above the substrate, a planarization layer disposed above the oxide thin-film transistor, an anode disposed on the planarization layer, a bank disposed above the planarization layer and having an opening portion through which a part of the anode is exposed, first and second dams disposed in the non-display area and configured by the planarization layer and the bank, a trench pattern configured by removing an insulating layer on a lower portion of the planarization layer between the first and second dams, a buffer layer made of silicon nitride and disposed above the first and second dams except for the trench pattern and the bank except for the opening portion, a light-emitting part disposed on the exposed anode and the buffer layer and a cathode disposed on the light-emitting part.

Other detailed matters of the exemplary aspects are included in the detailed description and the drawings.

According to the present disclosure, the buffer layer made of silicon nitride is formed above the bank, the hydrogen adsorption layer is formed in the dams, and the disconnected structure is formed between the dams. Therefore, it is possible to inhibit hydrogen from entering the oxide thin-film transistor, thereby improving characteristics and reliability of the thin-film transistor.

According to the present disclosure, the disconnected structure between the dams and the buffer layer made of silicon nitride may suppress penetration of outside moisture, thereby improving reliability and yield.

According to the present disclosure, the undercut structure is formed between the dams, thereby suppressing an overflow of the particle blocking layer and ensuring a process margin.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE ASPECT

Figure 1:
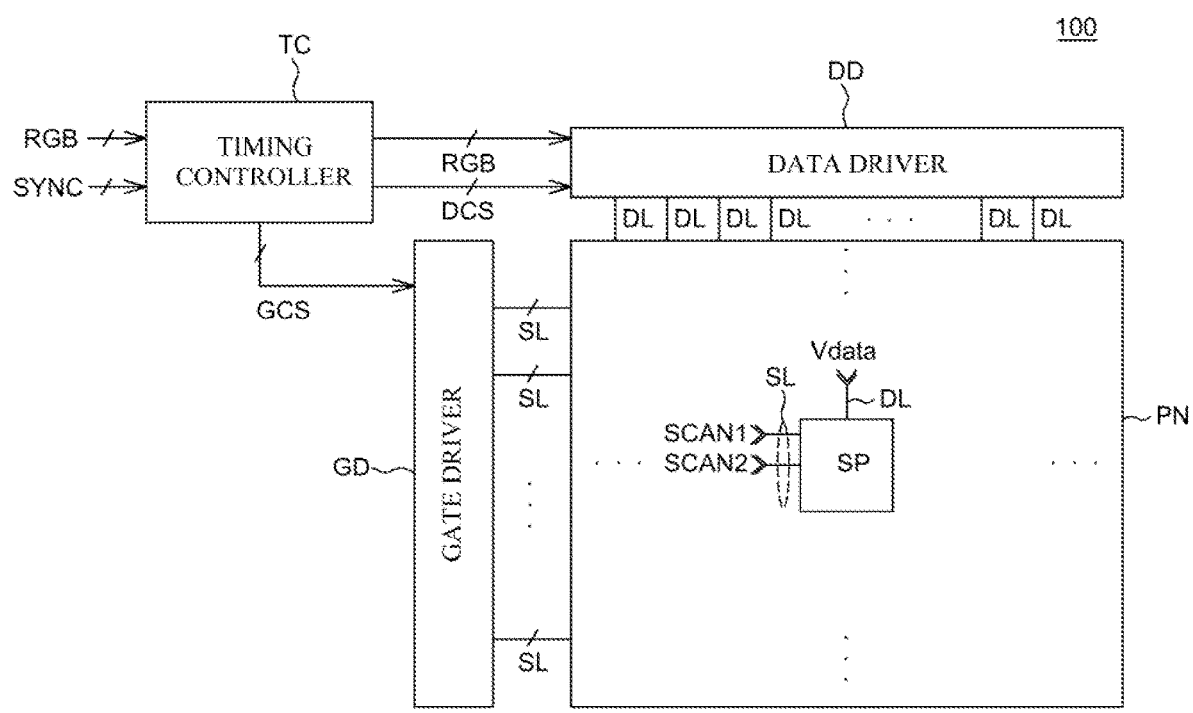
FIG. 1 is a schematic configuration view of an electroluminescent display device according to a first aspect of the present disclosure.

Advantages and characteristics of the present disclosure and a method of achieving the advantages and characteristics will be clear by referring to exemplary aspects described below in detail together with the accompanying drawings. However, the present disclosure is not limited to the exemplary aspects disclosed herein but will be implemented in various forms. The exemplary aspects are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary aspects of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various aspects of the present disclosure can be partially or entirely adhered to or combined with each other and can be interlocked and operated in technically various ways, and the aspects can be carried out independently of or in association with each other.

Hereinafter, various exemplary aspects of the present disclosure will be described in detail with reference to the accompanying drawings.

FIG. 1 is a schematic configuration view of a display device according to a first aspect of the present disclosure.

Referring to FIG. 1, an electroluminescent display device 100 according to a first aspect of the present disclosure may include a display panel PN including a plurality of subpixels SP, a gate driver GD and a data driver DD configured to supply various types of signals to the display panel PN, and a timing controller TC configured to control the gate driver GD and the data driver DD.

The gate driver GD may supply a plurality of scan signals to a plurality of scan lines SL based on a plurality of gate control signals GCS provided from the timing controller TC. The plurality of scan signals may include a first scan signal SCAN1 and a second scan signal SCAN2.

The data driver DD may convert image data RGB, which are inputted from the timing controller TC based on the plurality of data control signals DCS provided from the timing controller TC, into a data signal Vdata using a reference gamma voltage. Further, the data driver DD may supply the converted data signal Vdata to a plurality of data lines DL.

The timing controller TC may align the image data RGB inputted from the outside and supply the aligned image data RGB to the data driver DD. The timing controller TC may create a gate control signal GCS and a data control signal DCS by using a synchronizing signal SYNC inputted from the outside.

Figure 2:
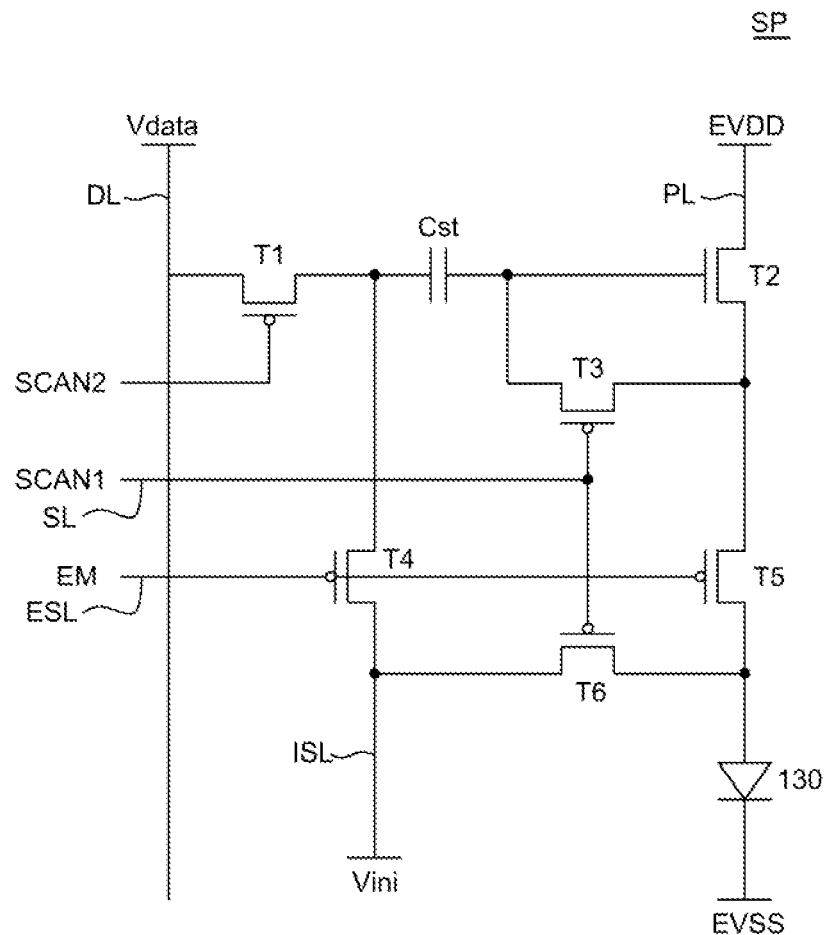
FIG. 2 is a circuit diagram of a subpixel of an electroluminescent display device in FIG. 1.

FIG. 2 is a circuit diagram of a subpixel of an electroluminescent display device in FIG. 1.

Referring to FIG. 2, the pixel circuit of each of the plurality of subpixels SP may include first to sixth transistors T1, T2, T3, T4, T5, and T6 and a capacitor Cst.

The first transistor T1 is connected to a second scan line and may be controlled by the second scan signal SCAN2 supplied through the second scan line. The first transistor T1 is electrically connected between the capacitor Cst and a data line for supplying a data signal Vdata.

The second transistor T2 may be electrically connected between the fifth transistor T5 and the high-potential power line to which a high-potential power signal EVDD is supplied. Further, a gate electrode of the second transistor T2 may be electrically connected to the capacitor Cst.

Further, the third transistor T3 may be controlled by the first scan signal SCAN1 supplied through a first scan line. The third transistor T3 may compensate for a threshold voltage of the second transistor T2. The third transistor T3 may be called a compensation transistor.

The fourth transistor T4 may be electrically connected to the capacitor Cst and an initialization signal line through which an initialization signal Vini is supplied. In addition, the fourth transistor T4 may be controlled based on a light emission control signal EM supplied through the light emission control signal line.

In addition, the fifth transistor T5 may be electrically connected between the second transistor T2 and the light emitting element 130. The fifth transistor T5 may be controlled based on the light emission control signal EM supplied through the light emission control signal line.

The sixth transistor T6 may be electrically connected between the anode of the light emitting element 130 and the initialization signal line through which the initialization signal Vini is supplied. The sixth transistor T6 may be controlled based on the first scan signal SCAN1 supplied through the first scan line.

The example in which the pixel circuit of each of the plurality of subpixels SP includes the first to sixth transistors T1, T2, T3, T4, T5, and T6 and the capacitor Cst has been described above, but the present disclosure is not limited thereto.

Hereinafter, a pixel structure of the electroluminescent display device according to the first aspect of the present disclosure will be described in more detail with reference to FIGS. 3 to 5.

Figure 3:
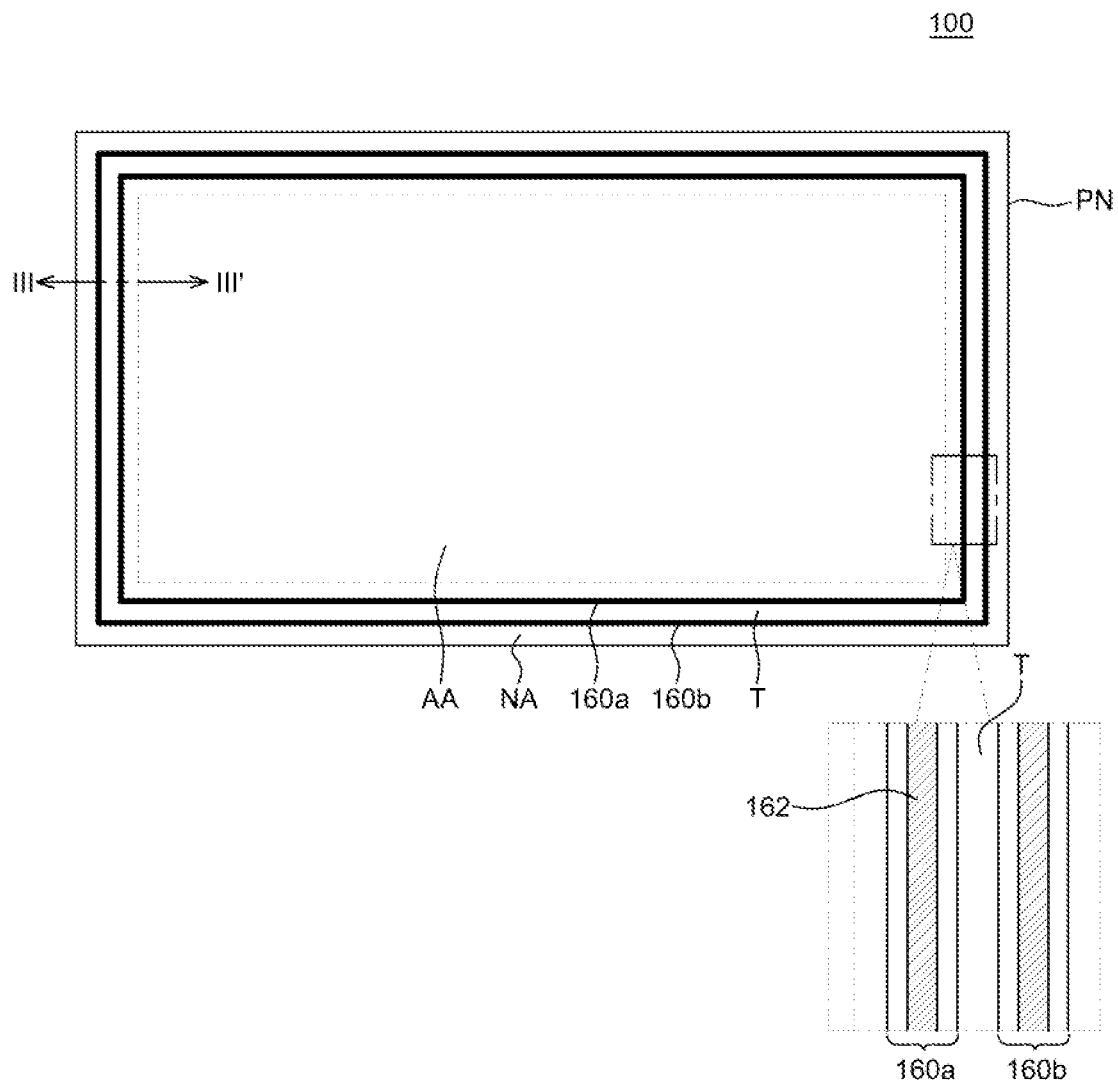
FIG. 3 is a top plan view of the electroluminescent display device in FIG. 1.

FIG. 3 is a top plan view of the electroluminescent display device in FIG. 1.

Figure 4:
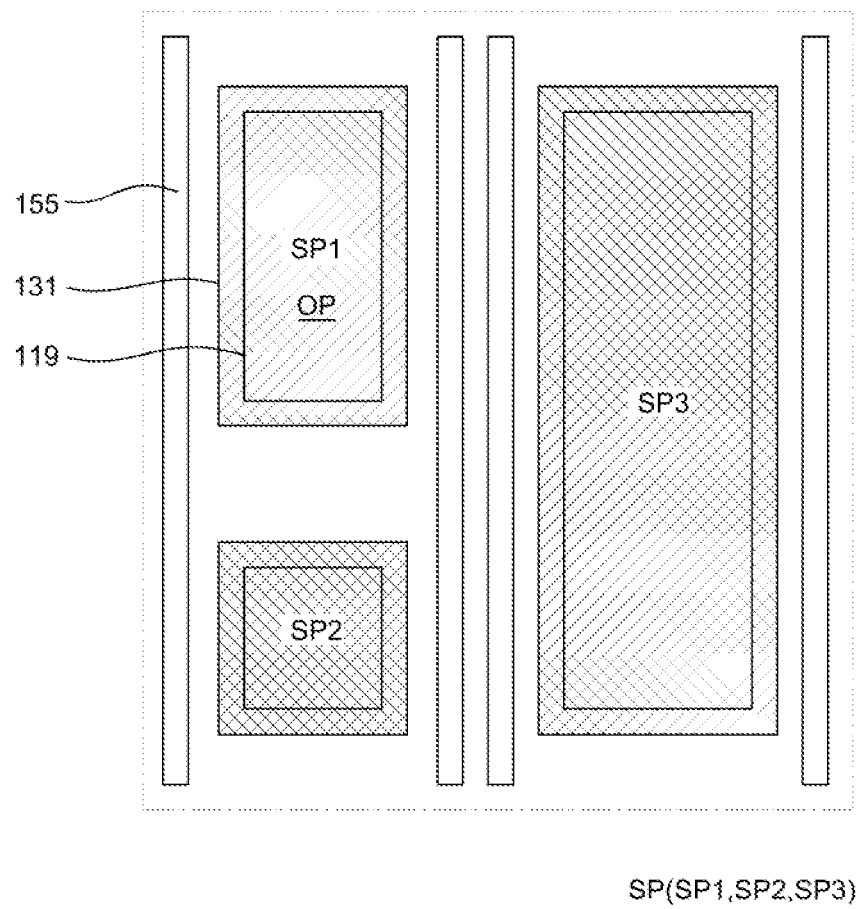
FIG. 4 is a top plan view illustrating a single pixel structure of an electroluminescent display device in FIG. 1.

FIG. 4 is a top plan view illustrating a single pixel structure of an electroluminescent display device in FIG. 1.

Figure 5:
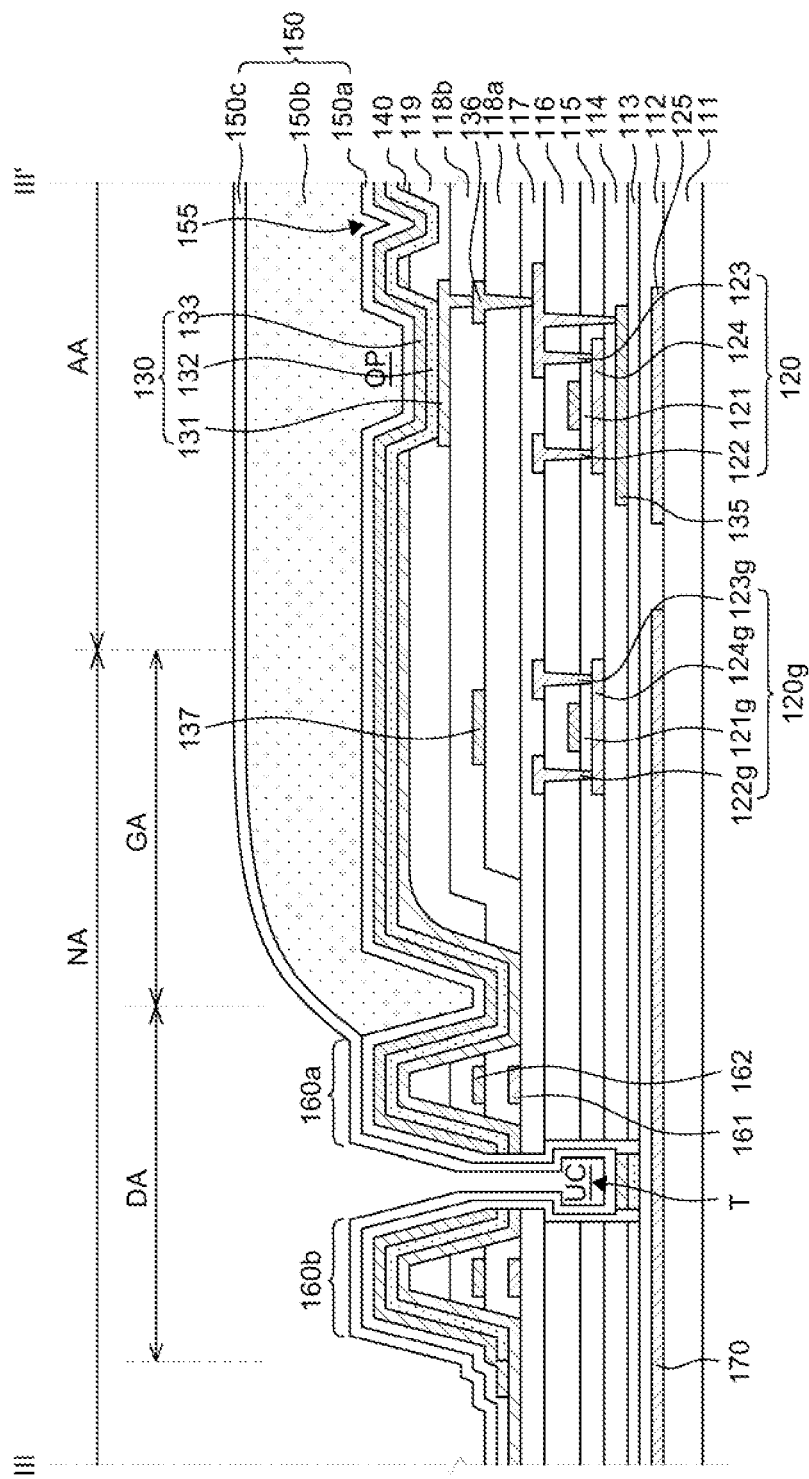
FIG. 5 is a cross-sectional view taken along line in FIG. 3.

FIG. 5 is a cross-sectional view taken along line in FIG. 3.

Figure 6:
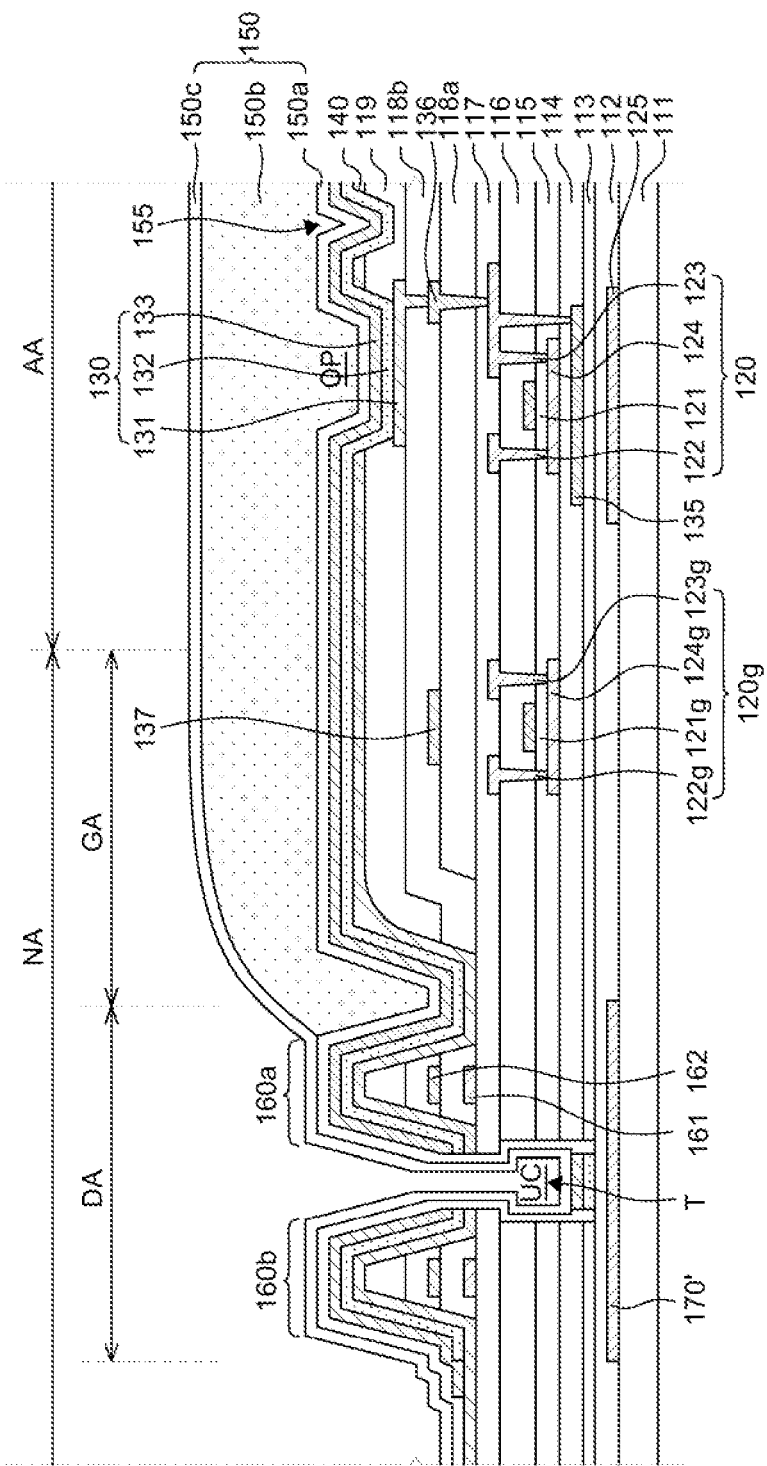
FIG. 6 is another cross-sectional view of the display panel according to a first aspect of the present disclosure.

FIG. 6 is another cross-sectional view of the display panel according to a first aspect of the present disclosure.

For the convenience of description, FIG. 4 illustrates only an anode 131 and a bank 119 among components of a light-emitting element 130. The bank 119 may be disposed in a region except for a region exposed by an opening portion OP and a display trench pattern 155.

FIGS. 5 and 6 are views illustrating a part of a cross-section of a display panel PN according to the first aspect of the present disclosure including a panel gate-in-panel (GIP) area GA and a dam area DA.

FIG. 5 illustrates a part of a cross-section of the display panel PN including a line (hereinafter, referred to as a 'main line') 170 passing through lower sides of dams 160a and 160b. FIG. 6 illustrates a part of a cross-section of the display panel PN including a line (hereinafter, referred to as an 'auxiliary line') 170' disposed along the dams 160a and 160b or disposed obliquely.

A data line, a high-potential power line, an initialization signal line, or the like may be a main line. A scan line for driving GIP, a sensing line, a low-potential power line, a ground voltage line, or the like may be an auxiliary line.

Referring to FIG. 3, the electroluminescent display device 100 according to the first aspect of the present disclosure may include the display panel PN, a flexible film, and a printed circuit board.

The display panel PN is a panel configured to display images to a user.

The display panel PN may include a display element configured to display images, a driving element configured to operate the display element, and lines configured to transmit various types of signals to the display element and the driving element. Different display elements may be defined depending on the types of display panels PN. For example, in a case in which the display panel PN is an organic light-emitting display panel, the display element may be an organic light-emitting element including an anode, an organic light-emitting layer, and a cathode.

Hereinafter, the assumption is made that the display panel PN is the organic light-emitting display panel. However, the display panel PN is not limited to the organic light-emitting display panel.

The display panel PN may include a display area AA and a non-display area NA.

The display area AA is an area of the display panel PN in which images are displayed.

The display area AA may include a plurality of subpixels constituting the plurality of pixels, and a circuit configured to operate the plurality of subpixels. The plurality of subpixels is minimum units constituting the display area AA. The display element may be disposed in each of the plurality of subpixels. The plurality of subpixels may constitute the pixel. For example, the plurality of subpixels may each include the light-emitting element including the anode, a light-emitting part, and a cathode. However, the present disclosure is not limited thereto. In addition, the circuit configured to operate the plurality of subpixels may include driving elements, lines, and the like. For example, the circuit may include, but not limited to, a thin-film transistor, a storage capacitor, a scan line, a data line, and the like.

The non-display area NA is an area in which no image is displayed.

FIG. 3 illustrates that the non-display area NA surrounds the display area AA having a quadrangular shape. However, the shapes and arrangements of the display area AA and the non-display area NA are not limited to the example illustrated in FIG. 3.

The display area AA and the non-display area NA may be suitable for the design of an electronic device equipped with the electroluminescent display device 100. For example, an exemplary shape of the display area AA may be a pentagonal shape, a hexagonal shape, a circular shape, an elliptical shape, or the like.

Various lines and circuits for operating the organic light-emitting element in the display area AA may be disposed in the non-display area NA. For example, the non-display area NA may include, but not limited to, link lines for transmitting signals to the plurality of subpixels and the circuit in the display area AA. The non-display area NA may include a drive IC such as a gate driver IC and a data driver IC.

Meanwhile, the left and right sides in FIG. 3 may be defined as gate pad parts on which the gate driver IC is disposed. The upper side and/or the lower side in FIG. 3 may be defined as data pad parts connected to the flexible film. However, the present disclosure is not limited thereto.

In this case, the gate driver IC may be formed independently of the display panel PN and electrically connected to the display panel in various ways. However, the gate driver IC may be configured in a gate-in-panel (GIP) manner so as to be mounted in the display panel PN.

The electroluminescent display device 100 may include various additional elements configured to create various signals or operate the pixels in the display area AA. The additional elements for operating the pixel may include an inverter circuit, a multiplexer, an electrostatic discharge (ESD) circuit, and the like. The electroluminescent display device 100 may also include additional elements related to functions other than the function of operating the pixel. For example, the electroluminescent display device 100 may include additional elements that provide a touch detection function, a user certification function (e.g., fingerprint recognition), a multi-level pressure detection function, a tactile feedback function, and the like. The additional elements may be positioned in the non-display area NA and/or an external circuit connected to a connection interface.

Although not illustrated, the flexible film is a film for supplying signals to the plurality of subpixels and the circuit in the display area AA. The flexible film may be electrically connected to the display panel PN. The flexible film is disposed at one end of the non-display area NA of the display panel PN. The flexible film may supply power voltage, data voltage, and the like to the plurality of subpixels and the circuit in the display area AA. For example, the drive IC such as the data driver IC may be disposed on the flexible film.

The printed circuit board may be disposed at one end of the flexible film and connected to the flexible film. The printed circuit board is a component configured to supply signals to the drive IC. The printed circuit board may supply the drive IC with various signals such as driving signals, data signals, and the like.

Referring to FIG. 4, the plurality of subpixels SP is an individual unit configured to emit light, and the light emitting elements may be disposed on the plurality of subpixels SP, respectively. The plurality of subpixels SP may include first subpixels SP1, second subpixels SP2, and third subpixels SP3 that emit light beams with different colors. For example, the first subpixel SP1 may be a green subpixel, the second subpixel SP2 may be a red subpixel, and the third subpixel SP3 may be a blue subpixel. However, the present disclosure is not limited thereto.

The plurality of third subpixels SP3 may be disposed in a plurality of columns. That is, the plurality of third subpixels SP3 may be disposed in the same column. Further, the plurality of first subpixels SP1 and the plurality of second subpixels SP2 may respectively be disposed between the plurality of columns in which the plurality of third subpixels SP3 is disposed. For example, the plurality of third subpixels SP3 may be disposed in one column, and the first and second subpixels SP1 and SP2 may be disposed in the adjacent columns. Further, the plurality of first subpixels SP1 and the plurality of second subpixels SP2 may be alternately disposed in the same column. However, the present disclosure is not limited thereto.

In addition, in the present disclosure, the configuration has been described in which the plurality of subpixels SP includes the first subpixel SP1, the second subpixel SP2, and the third subpixel SP3. The arrangements of the plurality of subpixels SP, the number of subpixels SP, and combinations of colors may be variously changed in accordance with design, but the present disclosure is not limited thereto.

Referring to FIGS. 2 and 4, a high-potential power line PL may be disposed between the plurality of subpixels SP and extend in a column direction. The plurality of high-potential power lines PL are lines for transmitting high-potential power signals EVDD to the plurality of subpixels SP. The plurality of high-potential power lines PL may each be disposed between the first subpixel nnSP1, the second subpixel SP2, and the third subpixel SP3. However, the present disclosure is not limited thereto.

A plurality of data lines DL may be disposed to extend in the same column direction as the plurality of high-potential power lines PL. The plurality of data lines DL are lines for transmitting data signals Vdata to the plurality of subpixels SP. For example, the plurality of data lines DL may each be disposed between the first subpixel SP1, the second subpixel SP2, and the high-potential power line PL or between the third subpixel SP3 and the high-potential power line PL. However, the present disclosure is not limited thereto.

In addition, a plurality of scan lines SL extending in the row direction may be disposed. The plurality of scan lines SL are lines for transmitting scan signals SCAN1 and SCAN2 to the plurality of subpixels SP. The plurality of scan lines SL may include first scan lines and second scan lines. The first scan line may be disposed between the first subpixel SP1 and the second subpixel SP2 and extend in the row direction. The second scan line may be disposed to cross the third subpixel SP3 and extend in the row direction.

In addition, a plurality of initialization signal lines ISL may be disposed between the plurality of subpixels SP and extend in the row direction, like the plurality of scan lines SL. The plurality of initialization signal lines ISL are lines for transmitting initialization signal Vini to the plurality of subpixels SP. The plurality of initialization signal lines ISL may each be disposed between the first subpixel SP1 and the second subpixel SP2. The plurality of initialization signal lines ISL may each be disposed between the first scan line and the second scan line. However, the present disclosure is not limited thereto.

A plurality of light-emitting control signal lines ESL may be disposed to extend in the row direction, like the plurality of scan lines SL. The plurality of light-emitting control signal lines ESL are lines for transmitting light-emitting control signals EM to the plurality of subpixels SP. The plurality of light-emitting control signal lines ESL may be disposed adjacent to the plurality of second scan lines. In addition, the plurality of light-emitting control signal line ESL may be disposed to extend in the row direction while traversing the third subpixel SP3. The second scan line may be disposed between the plurality of light-emitting control signal lines ESL and the plurality of initialization signal lines ISL.

The plurality of lines may be classified into direct current lines configured to transmit direct current signals and alternating current lines configured to transmit alternating current signals. Among the plurality of lines, the high-potential power line PL for transmitting the high-potential power signal EVDD, which is a direct current signal, or the initialization signal line ISL for transmitting the initialization signal Vini, which is a direct current signal, may be included in the direct current lines. In addition, among the plurality of lines, the scan line SL and the data line DL for transmitting the scan signal SCAN1 and SCAN2 and the data signal Vdata, which are alternating current signals, may be included in the alternating current lines.

A plurality of spacers may be disposed between the plurality of subpixels SP. A fine metal mask (FMM), which is a deposition mask, may be used to form the light emitting elements 130 on the plurality of subpixels SP. In this case, the plurality of spacers may be disposed to maintain a predetermined distance between the deposition mask and the substrate while suppressing damage caused by contact with the deposition mask.

In addition, a plurality of display trench patterns 155 may be disposed between the plurality of subpixels SP. The display trench pattern 155 may be formed by removing a part of a thickness of an upper portion of the buffer layer and a part of a thickness of an upper portion of the bank 119, but the present disclosure is not limited thereto. The trench pattern 155 may be formed by removing the overall thickness of the bank 119. For example, FIG. 4 illustrates that the two display trench patterns 155 are disposed between the plurality of subpixels SP, but the present disclosure is not limited thereto.

The display trench pattern 155 may decrease a thickness of the organic layer between the adjacent subpixels SP or increase a path, thereby minimizing leakage current caused by the organic layer between the adjacent subpixels SP.

The display trench pattern 155 may minimize lateral leakage current that occurs in a multi-stack structure. This configuration will be described below in detail with reference to FIGS. 5 and 6.

Meanwhile, according to the present disclosure, it is possible to ensure excellent characteristics of the display panel PN by using an oxide thin-film transistor having high mobility and low leakage current (off-current) properties. That is, the use of the oxide thin-film transistor may advantageously implement low electric power and stability, reduce costs, and makes it easy to manufacture a large-area display panel PN. In particular, in a case in which the drive circuit of the non-display area NA is configured as an oxide thin-film transistor like the display area AA, it is possible to reduce the number of processes and costs. However, the oxide thin-film transistor has a drawback in that initial characteristic, for example, the threshold voltage Vth is changed by hydrogen introduced from the outside or inside of the display panel PN.

In particular, in the case of the display panel in the related art, a dam structure at an outer periphery is made of only the organic layer, it is difficult to block outside moisture or hydrogen. In addition, because there is no structure for inhibiting an overflow of a particle blocking layer, there is a limitation in reducing a bezel width.

Therefore, the present disclosure is characterized by blocking outside moisture or hydrogen by forming a buffer layer, which is made of silicon nitride, on the bank and the dams 160a and 160b.

In addition, according to the present disclosure, hydrogen adsorption layers 162 are formed in the dams 160a and 160b. Further, a disconnected structure of a trench pattern T is formed between the dams 160a and 160b. Therefore, it is possible to inhibit hydrogen from being introduced into the oxide thin-film transistor at the outer periphery of the display area AA.

In addition, according to the present disclosure, an undercut structure is formed in the trench pattern T between the dams 160a and 160b, thereby suppressing an overflow of the particle blocking layer and thus ensuring a process margin.

Specifically, referring to FIGS. 4 to 6, a substrate 111 may be divided into the display area AA and the non-display area NA disposed outside the display area AA.

A thin-film transistor 120, the light-emitting element 130, and a sealing layer 150 may be disposed above the substrate 111 in the display area AA.

The non-display area NA may include the GIP area GA and the dam area DA.

First, a driving thin-film transistor 120g and the sealing layer 150 may be disposed above the substrate 111 in the GIP area GA.

Further, the plurality of dams 160a and 160b may be disposed in the dam area DA. The dams 160a and 160b according to the first aspect of the present disclosure may include two dams, i.e., a first dam 160a disposed at the inside and a second dam 160b disposed at the outside. However, the present disclosure is not limited thereto, and two or more dams may be provided.

The substrate 111 serves to support and protect the components of the electroluminescent display device that are disposed above the substrate 110.

Recently, the flexible substrate 111 may be made of a flexible material such as plastic having flexibility.

The flexible substrate 111 may be provided in the form of a film made of one selected from a group consisting of polyester-based polymer, silicon-based polymer, acrylic polymer, polyolefin-based polymer, and a copolymer thereof.

A first light-blocking layer 125 may be disposed on the substrate 111.

The first light-blocking layer 125 may be disposed below the thin-film transistor 120 in the display area AA.

The first light-blocking layer 125 may be made of a metallic material having a light blocking function in order to inhibit outside light from entering the semiconductor layer 124 of the thin-film transistor 120.

The first light-blocking layer 125 may each be configured as a single layer or multilayer made of any one of opaque metallic materials such as aluminum (Al), chromium (Cr), tungsten (W), titanium (Ti), nickel (Ni), neodymium (Nd), molybdenum (Mo), copper (Cu), and an alloy thereof.

Referring to FIG. 5, a main line 170 may be disposed on the substrate 111 in the non-display area NA.

The main line 170 may be disposed on the same layer and made of the same metal as the first light-blocking layer 125, but the present disclosure is not limited thereto. The main line 170 may be any one of the data line, the high-potential power line, and the initialization signal line. However, the present disclosure is not limited thereto.

The main line 170 disposed on the substrate 111 in the non-display area NA may extend to the GIP area GA and/or the display area AA through the dams 160a and 160b. The main line 170 may be electrically connected to various types of lines or electrodes in the GIP area GA and/or the display area AA through a jumping structure or the like.

In contrast, referring to FIG. 6, the auxiliary line 170' may be disposed on the substrate 111 in the non-display area NA.

The auxiliary line 170' may be disposed on the same layer and made of the same metal as the first light-blocking layer 125. However, the present disclosure is not limited thereto. The auxiliary line 170' may be any one of the scan line, the sensing line, the low-potential power line, and the ground voltage line. However, the present disclosure is not limited thereto.

The auxiliary line 170' disposed on the substrate 111 in the non-display area NA may extend to the GIP area GA and/or the display area AA through the dams 160a and 160b. The auxiliary line 170' may be electrically connected to various types of lines or electrodes in the GIP area GA and/or the display area AA through a jumping structure or the like.

In this case, the configuration has been described in which the main line 170 includes the line passing through the lower sides of the dams 160a and 160b, and the auxiliary line 170' includes the line disposed along the dams 160a and 160b or disposed obliquely. However, some lines may pass through the lower sides of the dams 160a and 160b and be simultaneously disposed along the dams 160a and 160b or disposed obliquely.

That is, the line may be provided on the same layer as the first light-blocking layer 125 below the dams 160a and 160b and disposed in a direction perpendicular to or oblique with respect to the dams 160a and 160b. Alternatively, the line may be provided on the same layer as the first light-blocking layer 125 below the dams 160a and 160b and disposed along the dams 160a and 160b.

Meanwhile, first and second buffer layers 112 and 113 may be sequentially disposed on the substrate 111 on which the first light-blocking layer 125 and the lines 170 and 170' are disposed.

The first and second buffer layers 112 and 113 may each be configured as a single insulating layer or have a structure in which a plurality of insulating layers is stacked in order to block foreign substances including moisture or oxygen introduced from the substrate 111. The first and second buffer layers 112 and 113 may each be configured as a single layer or multilayer made of an inorganic insulating material such as silicon oxide (SiOx), silicon nitride (SiNx), and aluminum oxide (AlOx). The first and second buffer layers 112 and 113 may be eliminated depending on the types of thin-film transistors 120. For example, the first buffer layer 112 may be made of silicon nitride, and the second buffer layer 113 may be made of silicon oxide. However, the present disclosure is not limited thereto.

A second light-blocking layer 135 may be disposed on the second buffer layer 113.

The second light-blocking layer 135 may be disposed below the thin-film transistor 120 in the display area AA.

The second light-blocking layer 135 may be made of a metallic material having a light blocking function in order to inhibit outside light from entering the semiconductor layer 124 of the thin-film transistor 120.

The second light-blocking layer 135 may each be configured as a single layer or multilayer made of any one of opaque metallic materials such as aluminum (Al), chromium (Cr), tungsten (W), titanium (Ti), nickel (Ni), neodymium (Nd), molybdenum (Mo), copper (Cu), and an alloy thereof.

A third buffer layer 114 may be disposed on the second light-blocking layer 135.

In this case, the third buffer layer 114 may be configured as a single insulating layer or have a structure in which a plurality of insulating layers is stacked in order to block foreign substances including moisture or oxygen introduced from the substrate 111. The third buffer layer 114 may be configured as a single layer or multilayer made of an inorganic insulating material such as silicon oxide, silicon nitride, or aluminum oxide. The third buffer layer 114 may be eliminated depending on the types of thin-film transistors 120. For example, the third buffer layer 114 may be made of silicon oxide. However, the present disclosure is not limited thereto.

The thin-film transistors 120 and 120g may be disposed above the third buffer layer 114.

The thin-film transistor 120 in the display area AA may be a driving transistor.

For the convenience, a switching transistor is not illustrated in FIGS. 5 and 6. The electroluminescent display device 100 may also include a sensing transistor, a compensating circuit, and the like.

The switching transistor is turned on by a gate pulse supplied through the gate line and transmits data voltage, which is supplied through the data line, to the gate electrode 121 of the driving transistor 120.

In response to a signal received from the switching transistor, the driving transistor 120 may transmit electric current, which is transmitted through the power line, to the anode 131. The driving transistor 120 may control light emission on the basis of the electric current transmitted to the anode 131.

The thin-film transistor 120 may include the gate electrode 121, the semiconductor layer 124, a source electrode 122, and a drain electrode 123.

The driving thin-film transistor 120g in the GIP area GA may be a switching transistor, but the present disclosure is not limited thereto.

For example, the driving thin-film transistor 120g may include a driving gate electrode 121g, a driving source electrode 122g, a driving drain electrode 123g, and a driving semiconductor layer 124g.

The semiconductor layers 124 and 124g may each be made of an oxide semiconductor. It is possible to ensure excellent characteristics of the display panel PN by using an oxide thin-film transistor having high mobility and low leakage current (off-current) properties. In particular, it is possible to reduce the number of processes and costs in a case in which the driving thin-film transistor 120g in the GIP area GA is made of an oxide thin-film transistor, like the display area AA.

The oxide semiconductor is excellent in mobility and uniformity properties. The oxide semiconductor may be made of materials based on indium-tin-gallium-zinc oxide (InSnGaZnO) which is quaternary metal oxide, materials based on indium-gallium-zinc oxide (InGaZnO), indium-tin-zinc oxide (InSnZnO), indium-aluminum-zinc oxide (InAlZnO), tin-gallium-zinc oxide (SnGaZnO), aluminum-gallium-zinc oxide (AlGaZnO), and tin-aluminum-zinc oxide (SnAlZnO) which are ternary metal oxide, materials based on indium-zinc oxide (InZnO), tin-zinc oxide (SnZnO), aluminum-zinc oxide (AlZnO), zinc-magnesium oxide (ZnMgO), tin-magnesium oxide (SnMgO), and indium-magnesium oxide (InMgO) which are binary metal oxide, materials based on indium oxide (InO), tin oxide (SnO), indium-gallium oxide (InGaO), and zinc oxide (ZnO). The present disclosure is not limited to a composition ratio of the respective elements.

The semiconductor layers 124 and 124g may each include source and drain regions including p-type or n-type impurities and a channel region between the source region and the drain region. The semiconductor layers 124 and 124g may each further include a low-concentration doping region between the source and drain regions adjacent to the channel region. However, the present disclosure is not limited thereto.

The source and drain regions are regions in which impurities are doped at high concentration. The source electrodes 122 and 122g and the drain electrodes 123 and 123g of the thin-film transistors 120 and 120g may respectively connected to the source and drain regions.

The p-type impurities or n-type impurities may be used as impurities ions. The p-type impurity may be one of boron (B), aluminum (Al), gallium (Ga), and indium (In). The n-type impurity may be one of phosphorus (P), arsenic (As), and antimony (Sb).

The channel region may be doped with the n-type impurities or p-type impurities depending on the structures of the thin-film transistors of NMOS or PMOS.

A gate insulating layer 115 may be disposed on the semiconductor layers 124 and 124g.

The gate insulating layer 115 may be configured as a single layer or multilayer made of silicon oxide (SiOx) and silicon nitride (SiNx). The gate insulating layer 115 may be disposed between the gate electrodes 121 and 121g and the semiconductor layers 124 and 124g so that the electric current flowing through the semiconductor layers 124 and 124g does not flow to the gate electrodes 121 and 121g. The silicon oxide has lower ductility than metal but has higher ductility than silicon nitride. A single layer or multilayer may be made of silicon oxide may be implemented in accordance with the properties of the silicon oxide. For example, the gate insulating layer 115 may be made of, but not limited to, silicon oxide.

First and second interlayer insulating layers 116 and 117 may be disposed between the gate electrodes 121 and 121g, the source electrodes 122 and 122g, and the drain electrodes 123 and 123g. The first and second interlayer insulating layers 116 and 117 may each be configured as a single layer or multilayer made of silicon oxide (SiOx) or silicon nitride (SiNx). For example, the first interlayer insulating layer 116 may be made of silicon oxide, and the second interlayer insulating layer 117 may be made of silicon nitride. However, the present disclosure is not limited thereto.

The second interlayer insulating layer 117 and the insulating layers disposed below the second interlayer insulating layer 117, i.e., the first, second, and third buffer layers 112, 113, and 114, the gate insulating layer 115, and the first interlayer insulating layer 116 may be disposed to extend to the non-display area NA.

In this case, in the first aspect of the present disclosure, the trench pattern T is formed by removing the second and third buffer layers 113 and 114, the gate insulating layer 115, the first interlayer insulating layer 116, and the second interlayer insulating layer 117 between the first dam 160a and second dam 160b in the dam area DA. However, the present disclosure is not limited thereto, and the trench pattern T may be formed by removing at least one insulating layer, sequentially from the top side, among the second and third buffer layers 113 and 114, the gate insulating layer 115, the first interlayer insulating layer 116, and the second interlayer insulating layer 117 between the first dam 160a and the second dam 160b.

In this case, the trench pattern T may expose the first buffer layer 112 disposed below the trench pattern T.

FIGS. 5 and 6 illustrate that the single trench pattern T is provided between the first dam 160a and the second dam 160b. However, the present disclosure is not limited thereto. A plurality of trench patterns T may be formed between the first dam 160a and the second dam 160b.

The trench pattern T has a predetermined depth. An increase in depth is advantageous in implementing the deposition without seam at the time of disconnecting the light-emitting part 132 and depositing a primary protective film 150a and a secondary protective film 150c of the sealing layer 150. For example, the trench pattern T has a depth of about 7500 Å. However, the present disclosure is not limited thereto.

The trench pattern T may be disposed along the first dam 160a and the second dam 160b and surround the periphery of the display area AA. However, the present disclosure is not limited thereto.

An undercut UC may be formed in the trench pattern T by a selective etching process.

That is, a selective etching process using a buffered-oxide etchant (BOE) is performed on a portion between the second interlayer insulating layer 117 made of silicon nitride and the second buffer layer 113, the third buffer layer 114, the gate insulating layer 115, and the first interlayer insulating layer 116 made of silicon oxide. Therefore, the undercut UC may be formed in the trench pattern T as the second buffer layer 113, the third buffer layer 114, the gate insulating layer 115, and the first interlayer insulating layer 116, which are disposed at the bottom side, are over-etched in comparison with the second interlayer insulating layer 117 disposed at the top side.

Specifically, a primary etching process is performed silicon nitride and silicon oxide in a vertical direction on at an equal etching rate by dry etching. Thereafter, the selective etching process is secondarily performed on the silicon oxide by wet etching using the BOE. Silicon oxide etched while reacting with the BOE, but silicon nitride does not react with the BOE. Therefore, the second buffer layer 113, the third buffer layer 114, the gate insulating layer 115, and the first interlayer insulating layer 116, which are made of silicon oxide, are over-etched in comparison with the second interlayer insulating layer 117 made of silicon nitride, such that the undercut UC may be formed in the trench pattern T.

For reference, BOE is a material used as an etching liquid (etchant) for the silicon oxide film. $NH_4F$ and HF are mixed, and HF directly acts at the time of etching silicon oxide. $NH_4F$ serves as a buffer solution that improves etching uniformity by adjusting an etching speed.

The gate electrodes 121 and 121g may each be configured as a single layer or multilayer made of a conductive metallic material such as copper (Cu), aluminum (Al), chromium (Cr), molybdenum (Mo), gold (Au), titanium (Ti), nickel (Ni), neodymium (Nd), or an alloy thereof. However, the present disclosure is not limited thereto.

In addition, the source electrodes 122 and 122g and the drain electrodes 123 and 123g may each be configured as a single layer or multilayer made of a conductive metallic material such as aluminum (Al), molybdenum (Mo), chromium (Cr), gold (Au), titanium (Ti), nickel (Ni), copper (Cu), or neodymium (Nd), or an alloy thereof. However, the present disclosure is not limited thereto.

One side of the drain electrode 123 may be electrically connected to the semiconductor layer 124, and the other side of the drain electrode 123 may be electrically connected to the second light-blocking layer 135. However, the present disclosure is not limited thereto.

The thin-film transistors 120 and 120g may be classified into a coplanar structure and an inverted staggered structure depending on the positions of the components constituting the thin-film transistors 120 and 120g. In this case, for example, in the case of the thin-film transistor having the inverted staggered structure, the gate electrode may be positioned at a side opposite to the source electrode and the drain electrode based on the semiconductor layer. As illustrated in FIGS. 5 and 6, in the case of the thin-film transistors 120 and 120g each having the coplanar structure, the gate electrodes 121 and 121g may be positioned at the same sides as the source electrodes 122 and 122g and the drain electrodes 123 and 123g based on the semiconductor layers 124 and 124g.

FIGS. 5 and 6 illustrate the thin-film transistors 120 and 120g each having the coplanar structure, as an example. However, the electroluminescent display device 100 according to the first aspect of the present disclosure may also include the thin-film transistor having the inverted staggered structure.

In addition, one of the thin-film transistors 120 and 120g may have the coplanar structure, and the other of the thin-film transistors 120 and 120g may have the inverted staggered structure.

A protective layer may be disposed above the thin-film transistors 120 and 120g.

The protective layer may serve to suppress unnecessary electrical connection between the components disposed above and below the protective layer. The protective layer may also serve to inhibit damage or contamination from the outside.

The first and second planarization layers 118a and 118b may be disposed on the thin-film transistors 120 and 120g. The first and second planarization layers 118a and 118b may be disposed above the thin-film transistors 120 and 120g to protect the thin-film transistors 120 and 120g, reduce a level difference therebetween, and reduce parasitic capacitance occurring between the thin-film transistors 120 and 120g, the scan line and data line, and the light-emitting element 130.

The first and second planarization layers 118a and 118b may each be made of, but not limited to, one or more materials among acrylic resin, epoxy resin, phenolic resin, polyamide-based resin, polyimide-based resin, unsaturated polyester-based resin, polyphenylene-based resin, polyphenylene sulfide-based resin, and benzocyclobutene. However, the present disclosure is not limited thereto.

In this case, the first planarization layer 118a may be disposed above the thin-film transistors 120 and 120g, and the second planarization layer 118b may be disposed on the first planarization layer 118a.

The first planarization layer 118a may be disposed to extend to a part of the non-display area NA, for example, a part of the GIP area GA.

The second planarization layer 118b may be disposed to extend to a part of the non-display area NA, for example, a part of the GIP area GA to cover the first planarization layer 118a.

The first and second planarization layers 118a and 118b and the bank 119 may be disposed to extend to a portion before the dam area DA and form a predetermined space between the first dam 160a and the first and second planarization layers 118a and 118b and the bank 119, and the space may be filled with the organic film 150b, thereby suppressing an overflow.

The intermediate electrode 136 may be connected to the thin-film transistor 120 through a contact hole formed in the first planarization layer 118a.

Meanwhile, the dams 160a and 160b according to the first aspect of the present disclosure may be disposed in the dam area DA. The dams 160a and 160b according to the first aspect of the present disclosure may include the two dams, i.e., the first dam 160a disposed at the inside and the second dam 160b disposed at the outside. However, the present disclosure is not limited thereto.

The dams 160a and 160b may be configured by the first and second planarization layers 118a and 118b and the bank 119 and each have a trapezoidal shape having a top surface narrower than a bottom surface. However, the present disclosure is not limited thereto.

In the dams 160a and 160b, first hydrogen adsorption layers 161 are disposed on the second interlayer insulating layer 117, second hydrogen adsorption layers 162 are disposed on the first planarization layer 118a. However, the present disclosure is not limited thereto.

In addition, a third hydrogen adsorption layer 137 may be disposed on the first planarization layer 118a in the GIP area GA.

The first, second, and third hydrogen adsorption layers 161, 162, and 137 may each be made of metal such as Ti having a hydrogen adsorption ability or a Ti alloy such as Ti/Al/Ti.

The materials constituting the first, second, and third hydrogen adsorption layers 161, 162, and 137 may include Sc, V, Mn, Fe, Pd, Nb, Zr, Y, Ta, Ce, La, Sm, U, and the like, which are excellent in hydrogen adsorption ability, in addition to Ti.

For reference, TiH has better hydrogen solubility than AlH, NiH, AgH, CuH, and ZnH.

In the case of metal hydride, for example, hydride of Ti is $TiH_{2.00}$, and this means that two hydrogen (H) atoms may be stored for each titanium (Ti) atom. It can be seen that $TiH_{2.00}$ is better in hydrogen adsorption ability as much as million times than $AlH_{<2.5 \times 10^{-8}}$ which is hydride of Al.

It can be seen that hydrides of Sc, V, Pd, Nb, Zr, Y, Ta, Ce, La, Sm, and U are $ScH_{>1.86}$, $VH_{1.00}$, $PdH_{0.724}$, $NbH_{1.1}$, $ZrH_{>1.70}$, $YH_{>2.85}$, $TaH_{0.79}$, $CeH_{>2.5}$, $LaH_{>2.03}$, $SmH_{3.00}$, and $UH_{>3.00}$, respectively.

The first, second, and third hydrogen adsorption layers 161, 162, and 137 may be used as various types of lines or electrodes while suppressing the diffusion of hydrogen.

Figure 7A:
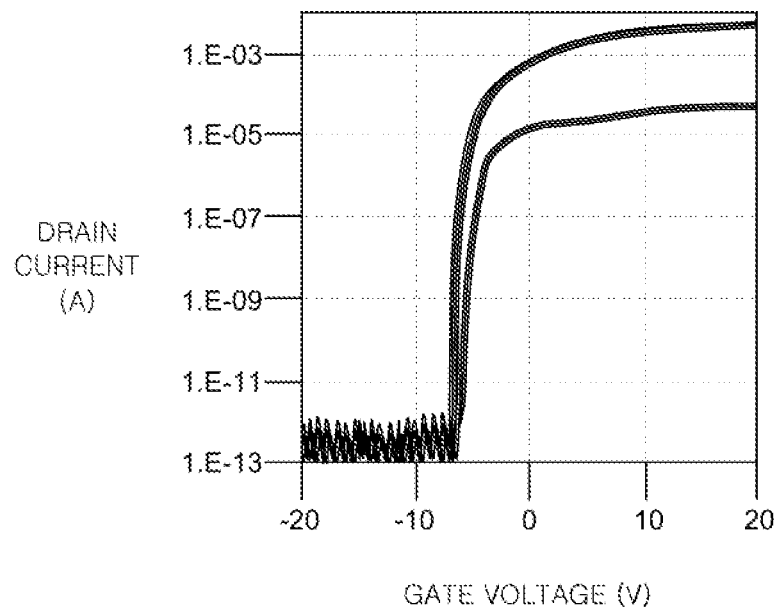
FIGS. 7A and 7B are graphs illustrating transfer properties of an oxide thin-film transistor with respect to whether a hydrogen adsorption layer is applied.
Figure 7B:
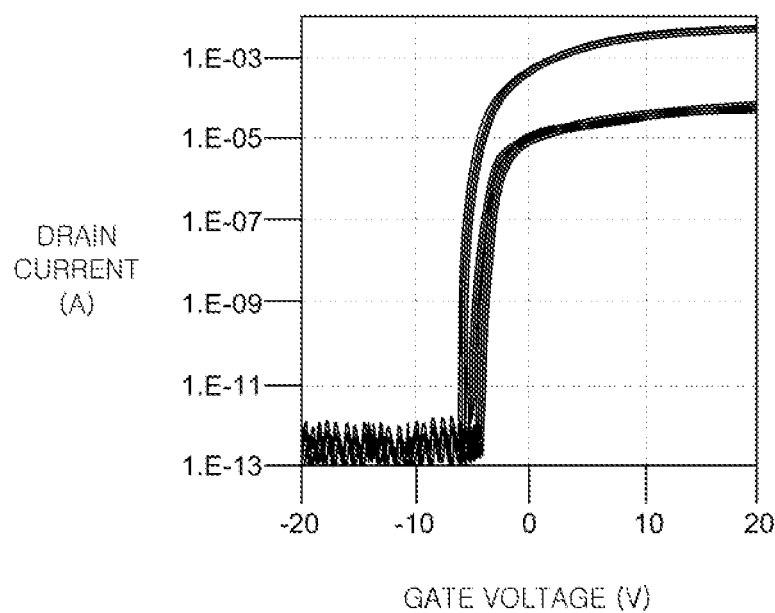

FIGS. 7A and 7B are graphs illustrating transfer properties of an oxide thin-film transistor with respect to whether a hydrogen adsorption layer is applied.

FIGS. 7A and 7B illustrate transfer properties of the oxide thin-film transistor when a hydrogen adsorption layer is applied as an intermediate electrode disposed above the oxide thin-film transistor and when the hydrogen adsorption layer is not applied as an intermediate electrode disposed above the oxide thin-film transistor.

FIG. 7A is a graph of a comparative example to which no hydrogen adsorption layer is applied, and FIG. 7B is a graph of an example to which the hydrogen adsorption layer is applied.

In this case, a heat treatment was performed for 3 hours at about 120° C.

Referring to FIG. 7A, it can be seen that in the case of the comparative example, a threshold voltage Vth is about −5.04 V, a sub-threshold swing (SS) is 0.17, and field-effect mobility (μ) is 7.96 $cm^2$/Vs.

Referring to FIG. 7B, in the case of the example, it can be seen that a threshold voltage Vth is about −3.96 V, a sub-threshold swing (SS) is 0.16, and field-effect mobility (μ) is 7.8 $cm^2$/Vs.

Therefore, when the hydrogen adsorption layer is applied like the above-mentioned example, the threshold voltage Vth is decreased from 5 V to 4 V.

Meanwhile, the light-emitting element 130 may be disposed on the second planarization layer 118b and includes the anode 131, the light-emitting part 132, and the cathode 133.

The anode 131 may be disposed on the second planarization layer 118b.

The anode 131 is an electrode that serves to supply positive holes to the light-emitting part 132. The anode 131 may be electrically connected to the thin-film transistor 120 through a contact hole formed in the second planarization layer 118b.

In the case of the bottom emission type display panel that emits light toward the lower side at which the anode 131 is disposed, the anode 131 may be made of, but not limited to, indium-tin oxide (ITO), indium-zinc oxide (IZO), or the like, which is a transparent electrically conductive material. However, the present disclosure is not limited thereto.

In contrast, in the case of the top emission type display panel that emits light toward the upper side at which the cathode 133 is disposed, the anode 131 may further include a reflective layer so that the emitted light may be reflected by the anode 131 and more smoothly discharged to the upper side at which the cathode 133 is disposed.

That is, the anode 131 may have a two-layer structure in which a reflective layer and a transparent conductive layer made of a transparent electrically conductive material are sequentially stacked. Alternatively, the anode 131 may have a three-layer structure in which the transparent conductive layer, the reflective layer, and the transparent conductive layer are sequentially stacked. The reflective layer may be made of an alloy containing silver (Ag).

A bank 119 may be disposed on the anode 131 and the second planarization layer 118b.

The bank 119 disposed above the anode 131 and the second planarization layer 118b may define the subpixel by dividing an area in which light is actually emitted, i.e., a light-emitting area.

The bank 119 may be formed by performing photolithography after forming a photoresist on the upper portion of the anode 131. The photoresist refers to photosensitive resin having solubility that is changed in respect to a developer by the action of light. A particular pattern may be obtained by exposing and developing the photoresist. The photoresists may be classified into a positive photoresist and a negative photoresist. In this case, the positive photoresist refers to a photoresist in which solubility of an exposed part in respect to a developer is increased by exposure. When the positive photoresist is developed, a pattern from which the exposed part is removed is obtained. The negative photoresist refers to a photoresist in which solubility of an exposed part in respect to a developer is decreased by exposure. When the negative photoresist is developed, a pattern from which a non-exposed part is removed is obtained.

A fine metal mask (FMM), which is a deposition mask, may be used to form the light-emitting part 132 of the light-emitting element 130.

In addition, a spacer may be disposed above the bank 119 and made of one of polyimide, photo acrylic, and benzocyclobutene which are transparent organic materials. The spacer is used to inhibit damage caused by contact with the deposition mask disposed on the bank 119. The spacer serves to maintain a predetermined distance between the bank 119 and the deposition mask.

As described above, the bank 119 may be disposed in a region except for a region exposed by an opening portion OP and a display trench pattern 155.

That is, the opening portion OP may be formed by removing the bank 119 in the light-emitting area and exposing a partial region of the anode 131.

In addition, the plurality of display trench patterns 155 may be disposed between the plurality of subpixels SP. The display trench pattern 155 may be formed by removing a part of a thickness of the upper portion of the buffer layer 140 and a part of a thickness of the upper portion of the bank 119, but the present disclosure is not limited thereto. The trench pattern 155 may be formed by removing the overall thickness of the bank 119. For example, FIG. 4 illustrates that the two display trench patterns 155 are disposed between the plurality of subpixels SP, but the present disclosure is not limited thereto.

The display trench pattern 155 may decrease a thickness of the light-emitting part 132 between the adjacent subpixels SP or increase a path, thereby minimizing leakage current caused by the light-emitting part 132 between the adjacent subpixels SP.

The display trench pattern 155 may minimize lateral leakage current that occurs in a multi-stack structure.

That is, in order to improve quality and productivity of the organic light-emitting display device, there have been proposed structures of various organic light-emitting elements for improving efficiency of the organic light-emitting element, increasing the lifespan, and reducing the power consumption.

Therefore, there has been proposed the structure of the organic light-emitting element to which a single stack, i.e., a single light-emitting unit (an electroluminescence (EL) unit) is applied. Further, there also has been proposed the organic light-emitting element having a tandem structure that uses a plurality of stacks, for example, a stack of a plurality of light-emitting units in order to implement improved efficiency and lifespan properties.

In the case of the tandem structure, i.e., the organic light-emitting element having a two-stack structure using a stack of a first light-emitting unit and a second light-emitting unit, the light-emitting regions in which light is emitted by recombination of electrons and holes are positioned in the first light-emitting unit and the second light-emitting unit, respectively. As a result, light emitted from a first light-emitting layer in the first light-emitting unit and light emitted from a second light-emitting layer in the second light-emitting unit may generate reinforcement interference, thereby providing higher brightness in comparison with an organic light-emitting element having a single stack structure.

In addition, in the organic light-emitting element, a distance between the plurality of subpixels constituting one pixel decreases as the organic light-emitting display device has high resolution. Except for the light-emitting layer (or emission layer (EML)), auxiliary organic layers, such as a hole injection layer (HIL), a hole transport layer (HTL), a charge generating layer (CGL), an electron injection layer (EIL), and an electron transport layer (ETL), are formed in the common layer by deposition using a common mask so as to correspond to all the plurality of subpixels. The light-emitting layers in the plurality of subpixels for generating light beams with different wavelengths may be individually formed by deposition using a fine metal mask so as to correspond to the respective subpixels.

In the case of the above-mentioned organic light-emitting element, horizontal leakage current (lateral leakage current) occurs in the horizontal direction of the organic light-emitting element through the common layer formed in the organic light-emitting element when the voltage is applied between the anode and the cathode. For this reason, a color mixture defect occurs because not only the subpixel required to emit light emits light, but also an undesired subpixel positioned adjacent to the subpixel, which is required to emit light, emits light.

The color mixture defect may become severer on the organic light-emitting element having the two-stack structure including the stack of the first and second light-emitting units using reinforcing interference in comparison with the organic light-emitting element having the single-stack structure.

Therefore, according to the present disclosure, as illustrated in FIGS. 5 and 6, the display trench patterns 155 are formed between the plurality of subpixels SP. The display trench pattern 155 may decrease a thickness of the light-emitting part 132 between the adjacent subpixels SP or increase the path. Therefore, it is possible to minimize leakage current caused by the light-emitting part 132 between the adjacent subpixels SP.

The bank 119 may be disposed to extend to a part of the non-display area NA, i.e., a part of the GIP area (GA), but the present disclosure is not limited thereto.

Meanwhile, the first aspect of the present disclosure is characterized in that a buffer layer 140 made of silicon nitride is formed on the bank 119 and the dams 160a and 160b.

Silicon nitride (SiNx) has a higher density than silicon oxide (SiOx) and thus is effective in suppressing the diffusion of hydrogen.

The buffer layer 140 may be disposed on the second interlayer insulating layer 117 and the dams 160a and 160b in the non-display area NA and on the bank 119 except for the opening portion OP.

The buffer layer 140 may be disposed on side surfaces and top surfaces of the dams 160a and 160b except for the trench pattern T. However, the present disclosure is not limited thereto.

In the first aspect of the present disclosure, the buffer layer 140 may suppress the diffusion of moisture or hydrogen introduced from the outside or the top side, thereby improving characteristics and reliability of the oxide thin-film transistors 120 and 120g.

That is, in the case of a large-screen electroluminescent display device, hydrogen produced from the sealing layer may affect the oxide thin-film transistor. Therefore, in the present disclosure, the buffer layer 140 made of silicon nitride may be formed on the bank 119 and the dams 160a and 160b, thereby blocking hydrogen.

For example, it can be seen that in a case in which a dual insulating layer made by depositing silicon nitride on silicon oxide is applied, there is an effect of improving element properties and blocking hydrogen.

In the case of the comparative example, silicon oxide with a thickness of about 3,000 Å was applied. In the case of the example, a dual insulating layer made by stacking silicon nitride with a thickness of about 1,000 Å on silicon oxide with a thickness of about 3,000 Å was applied. A channel of a measurement element has a width of 750 μm and a length of 7 μm to maximize an influence of hydrogen.

It can be seen that in the case of the aspect to which the dual insulating layer is applied, the threshold voltage Vth may decrease, thereby ensuring the element properties.

Figure 8:
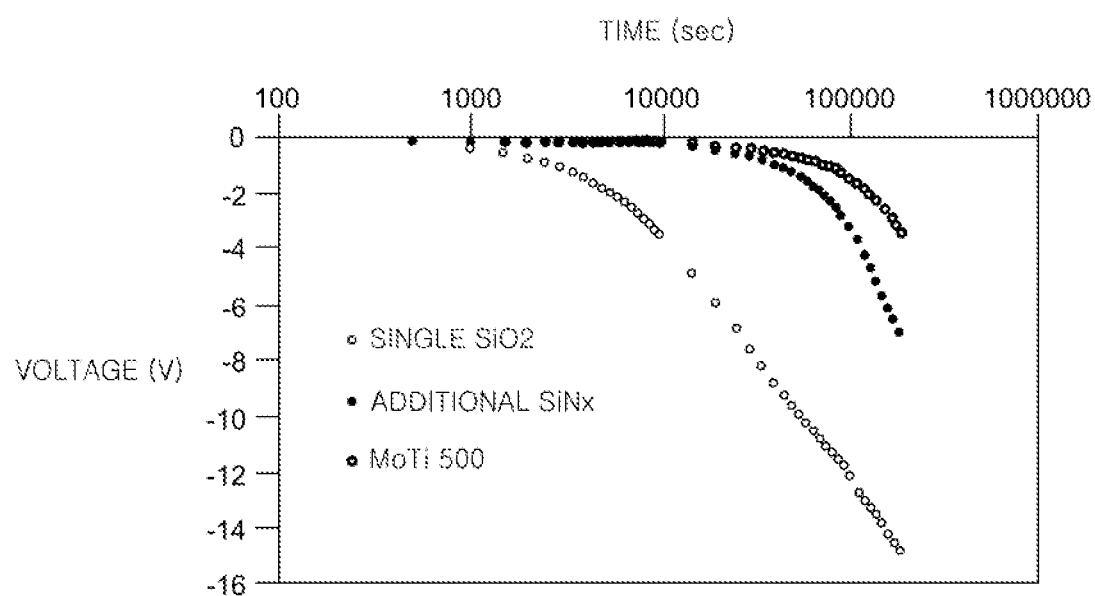
FIG. 8 is a graph illustrating a negative bias temperature stress (NBTS) result of the oxide thin-film transistor.

FIG. 8 is a graph illustrating a negative bias temperature stress (NBTS) result of the oxide thin-film transistor.

FIG. 8 illustrates changes in threshold voltage Vth over time in respect to a high-temperature bias stress (NBTS) test on MoTi with a thickness of 500 Å in addition to the comparative example and the example.

The NBTS was performed at a voltage of −30 V and a temperature of 110° C. The sealing layer was formed to have a thickness of 1 μm by using silicon nitride at a low temperature of 80° C.

Referring to FIG. 8, according to a result of the NBTS test, it can be seen that the NBTS in the aspect adopting the dual insulating layer is improved at the same level as a case in which a thickness of MoTi is increased to 500 Å.

Next, referring to FIGS. 4 to 6, the light-emitting part 132 may be disposed between the anode 131 and the cathode 133.

The light-emitting part 132 serves to emit light. The light-emitting part 132 may include at least one of a hole injection layer (HIL), a hole transport layer (HTL), a light-emitting layer, an electron transport layer (ETL), and an electron injection layer (EIL). Some components may be eliminated depending on the structure or properties of the electroluminescent display device. In this case, an electroluminescent layer and an inorganic light-emitting layer may be applied as the light-emitting layer.

The hole injection layer is disposed on the anode 131 and serves to facilitate the injection of the positive holes.

The hole transport layer is disposed on the hole injection layer and serves to smoothly transmit the positive holes to the light-emitting layer.

The light-emitting layer is disposed on the hole transport layer. The light-emitting layer may be made of a material capable of emitting light with a particular color, thereby emitting the light with the particular color. Further, a phosphorescent material or a fluorescent material may be used as the light-emitting material.

The electron injection layer may further be disposed on the electron transport layer. The electron injection layer is an organic layer that facilitates the injection of electrons from the cathode 133. The electron injection layer may be eliminated depending on the structure and properties of the electroluminescent display device.

Meanwhile, an electron blocking layer for blocking a flow of electrons or a hole blocking layer for blocking a flow of positive holes is further disposed at a position adjacent to the light-emitting layer. Therefore, it is possible to inhibit the electron from moving from the light-emitting layer and passing through the adjacent hole transport layer when the electrons are injected into the light-emitting layer or inhibit the positive hole from moving from the light-emitting layer and passing through the adjacent electron transport layer when the positive holes are injected into the light-emitting layer, thereby improving luminous efficiency.

The light-emitting part 132 may be disposed to extend to a part of the non-display area NA. For example, the light-emitting part 132 may be disposed to extend to the non-display area NA so as to convert the second dam 160b. However, the present disclosure is not limited thereto.

The light-emitting part 132 is not deposited on an inner surface of the trench pattern T. The reason is that because the light-emitting part 132 is typically formed by evaporation deposition, the light-emitting part 132 is disconnected (or cut) at the portion of the undercut UC when the undercut UC is formed. Therefore, the light-emitting part 132 may be deposited on the side surfaces and the top surfaces of the dams 160a and 160b and the bottom surface of the trench pattern T except for the inner surface of the trench pattern T.

The disconnection of the light-emitting part 132 blocks a route through moisture introduced from the outside enters the display area AA, thereby improving reliability.

The cathode 133 is disposed on the light-emitting part 132 and serves to supply the electrons to the light-emitting part 132. In the case of the bottom-emission type display panel, the cathode 133 needs to supply electrons. Therefore, the cathode 133 may be made of a metallic material such as magnesium, silver-magnesium, or the like that is an electrically conductive material having a low work function. However, the present disclosure is not limited thereto.

In contrast, in the case of the top-emission type display panel, the cathode 133 may be made of transparent conductive oxide such as indium tin oxide (ITO), indium zinc oxide (IZO), indium-tin-zinc oxide (ITZO), zinc oxide (ZnO), and tin oxide (TO).

The cathode 133 may be disposed to extend to a part of the non-display area NA so as to cover the light-emitting part 132. However, the present disclosure is not limited thereto.

The cathode 133 may not be deposited on the inner surface of the trench pattern T. That is, the cathode 133 may be deposited on the side surfaces and the top surfaces of the dams 160a and 160b and the bottom surface of the trench pattern T except for the inner surface of the trench pattern T.

The sealing layer 150 may be disposed on the cathode 133.

The sealing layer 150 will be specifically described. A capping layer is formed on a top surface of the substrate 111 having the light-emitting element 130, and the primary protective film 150a, the organic film 150b, and the secondary protective film 150c are sequentially formed on the capping layer, thereby configuring the sealing layer 150 that is a sealing mean. However, the number of inorganic and organic films constituting the sealing layer 150 is not limited thereto.

The primary protective film 150a is configured as an inorganic insulating film and thus does not have good stack coverage because of a level difference at a lower side thereof. However, the organic film 150b performs the planarization, such that the secondary protective film 150c is not affected by a level difference caused by a lower film. In addition, the organic film made of polymer may have a sufficiently large thickness, thereby solving a problem of cracks caused by foreign substances. Therefore, the organic film 150b may also be called a particle blocking layer.

The protective films disposed in multiple layers for sealing may be positioned on the entire surface of the substrate 111 including the secondary protective film 150c so as to be opposite to each other. A transparent adhesive agent having adhesive properties may be interposed between the sealing layer 150 and the protective film.

The primary protective film 150a may be disposed to extend to a part of the non-display area NA, but the present disclosure is not limited thereto. For example, the primary protective film 150a may be deposited in the GIP area GA and the dam area DA including the inner surface of the trench pattern T.

The organic film 150b is disposed on the portion before the first dam 160a. As described above, the first and second planarization layers 118a and 118b and the bank 119 may be disposed to extend to a portion before the dam area DA and form a predetermined space between the first dam 160a and the first and second planarization layers 118a and 118b and the bank 119, and the space may be filled with the organic film 150b, thereby suppressing an overflow. In addition, in the first aspect of the present disclosure, the undercut UC is formed in the trench pattern T between the dams 160a and 160b. Therefore, even if the organic film 150b flows over the first dam 160a, the organic film 150b is inhibited from overflowing to the second dam 160b.

The secondary protective film 150c may be disposed to extend to a part of the non-display area NA, but the present disclosure is not limited thereto. For example, the secondary protective film 150c may be deposited in the GIP area GA and the dam area DA including the inner surface of the trench pattern T.

A polarizing plate may be attached onto the protective film to suppress the reflection of light introduced from the outside, but the present disclosure is not limited thereto.

Meanwhile, according to the present disclosure, an additional line may be disposed on the gate electrode layer disposed below the dam, and the additional line may be used as a hydrogen absorption layer. This configuration will be described with reference to FIGS. 9, 10A, and 10B.

Figure 9:
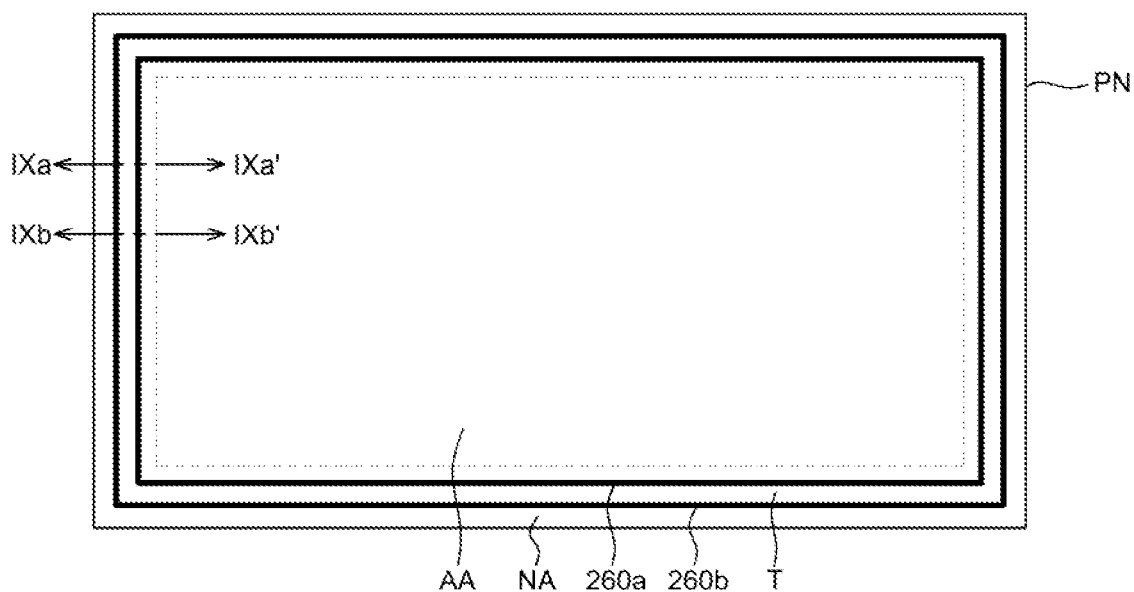
FIG. 9 is a top plan view of an electroluminescent display device according to a second aspect of the present disclosure.

FIG. 9 is a top plan view of an electroluminescent display device according to a second aspect of the present disclosure.

Figure 10A:
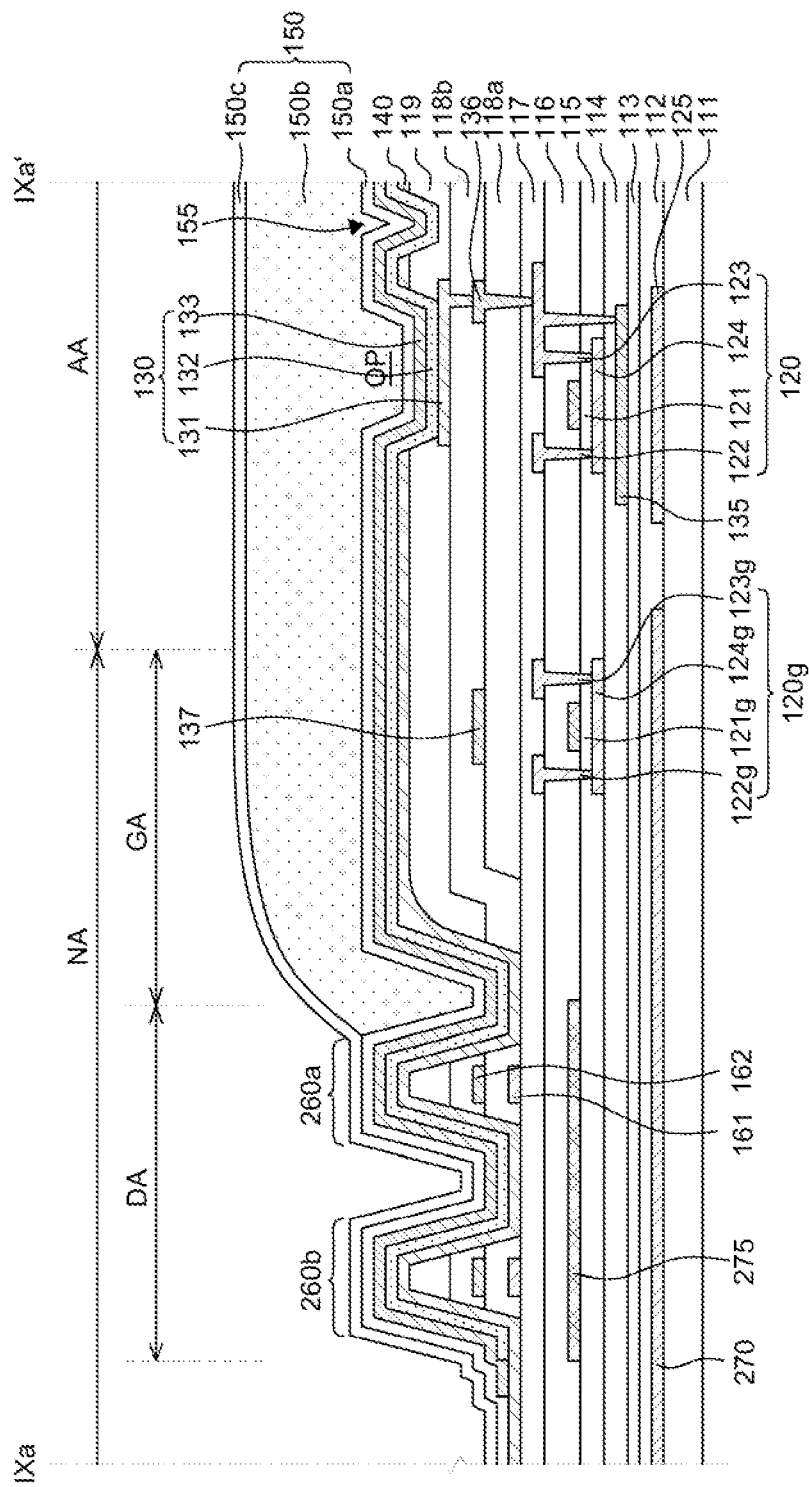
FIG. 10A is a cross-sectional view taken along line IXa-IXa' in FIG. 9.

FIG. 10A is a cross-sectional view taken along line IXa-IXa' in FIG. 9.

Figure 10B:
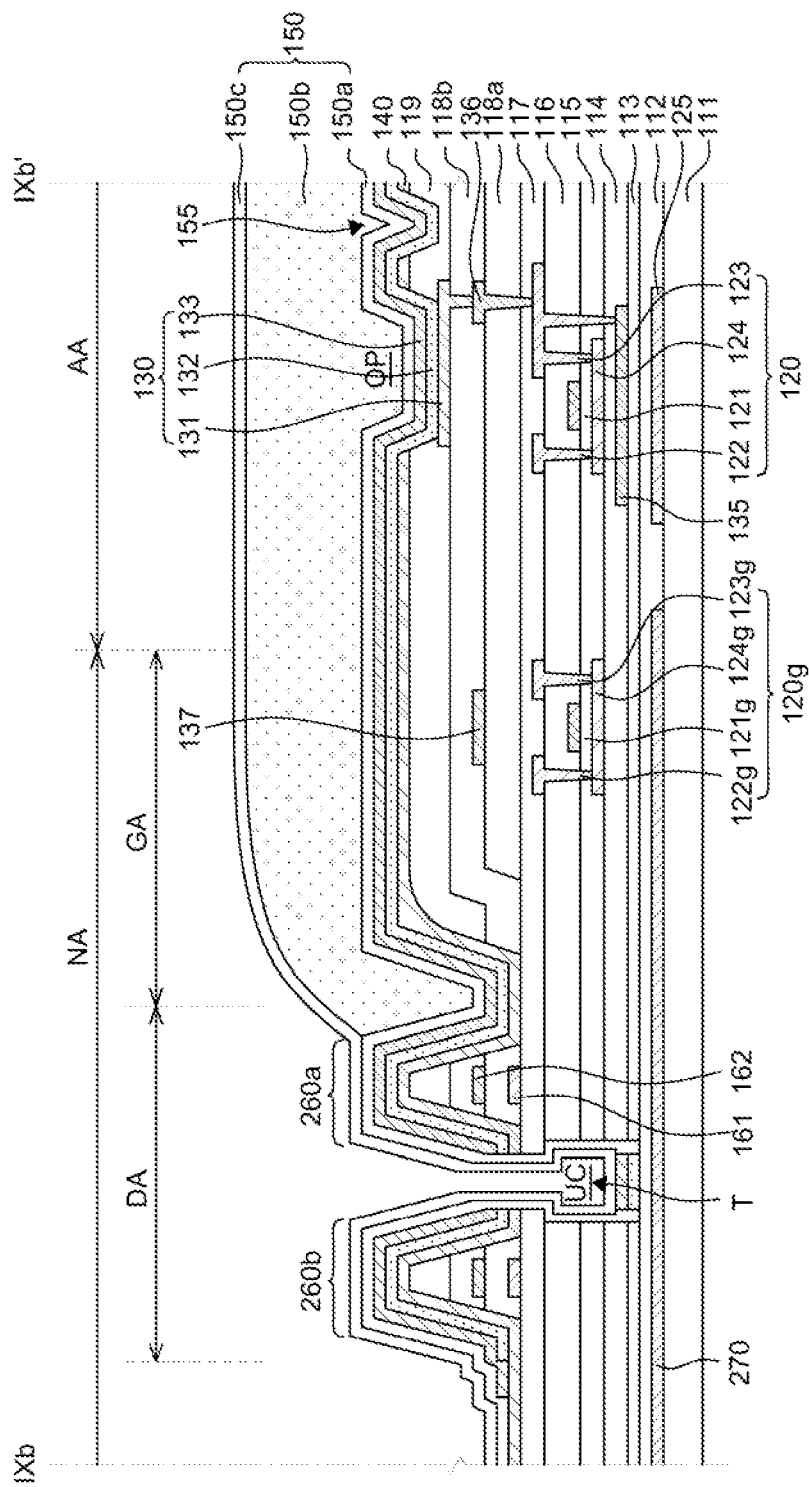
FIG. 10B is a cross-sectional view taken along line IXb-IXb' in FIG. 9.

FIG. 10B is a cross-sectional view taken along line IXb-IXb' in FIG. 9.

The second aspect illustrated in FIGS. 9, 10A, and 10B is substantially identical in configuration to the first aspect illustrated in FIGS. 3 to 6 but differs from the first aspect in that an additional line 275 is disposed below dams 260a and 260b. Therefore, repeated descriptions of the identical components will be omitted. The same reference numerals are used for the same components.

For the convenience, FIG. 9 illustrates that the trench pattern T surrounds the display area AA. However, because the trench pattern T is not present in the region in which the additional line 275 is disposed, the trench pattern T may be disposed to surround the display area AA in a state in which the trench pattern T is divided into a plurality of pieces.

FIGS. 10A and 10B each illustrate a part of a cross-section of the display panel PN according to the second aspect of the present disclosure including the GIP area GA and the dam area DA.

FIG. 10A illustrates a part of a cross-section of the display panel PN in which the additional line 275 is disposed below the dams 260a and 260b. FIG. 10B illustrates a part of a cross-section of the display panel PN in which the additional line 275 is not disposed below the dams 260a and 260b.

Referring to FIGS. 9, 10A, and FIG. 10B, an electroluminescent display device 200 according to the second aspect of the present disclosure may include the display panel PN including the display area AA and the non-display area NA.

A thin-film transistor 120, the light-emitting element 130, and a sealing layer 150 may be disposed above the substrate 111 in the display area AA.

The non-display area NA may include the GIP area GA and the dam area DA.

In this case, the driving thin-film transistor 120g and the sealing layer 150 may be disposed above the substrate 111 in the GIP area GA.

Further, the plurality of dams 260a and 260b may be disposed in the dam area DA. The dams 260a and 260b according to the second aspect of the present disclosure may include two dams, i.e., a first dam 260a disposed at the inside and a second dam 260b disposed at the outside. However, the present disclosure is not limited thereto, and two or more dams may be provided.

A main line 270 may be disposed on the substrate 111 in the non-display area NA.

The main line 270 may be disposed on the same layer and made of the same metal as the first light-blocking layer 125, but the present disclosure is not limited thereto. The main line 270 may be any one of the data line, the high-potential power line, and the initialization signal line. However, the present disclosure is not limited thereto.

The main line 270 disposed on the substrate 111 in the non-display area NA may extend to the GIP area GA and/or the display area AA through the dams 260a and 260b. The main line 270 may be electrically connected to various types of lines or electrodes in the GIP area GA and/or the display area AA through a jumping structure or the like.

Meanwhile, an auxiliary line may be disposed on the substrate 111 in the non-display area NA.

The auxiliary line may be disposed on the same layer and made of the same metal as the first light-blocking layer 125. However, the present disclosure is not limited thereto. The auxiliary line may be any one of the scan line, the sensing line, the low-potential power line, and the ground voltage line. However, the present disclosure is not limited thereto.

The auxiliary line disposed on the substrate 111 in the non-display area NA may extend to the GIP area GA and/or the display area AA through the dams 260a and 260b. The auxiliary line may be electrically connected to various types of lines or electrodes in the GIP area GA and/or the display area AA through a jumping structure or the like.

FIGS. 10A and 10B illustrate an example in which the main line 270 passes through the lower sides of the dams 260a and 260b. However, the present disclosure is not limited thereto. The main line 270 may pass through one partial region, and the auxiliary line may pass through another partial region.

The additional line 275 may be disposed on the gate insulating layer 115 in the non-display area NA.

The additional line 275 may be disposed on the same layer and made of the same metal as the gate electrodes 121 and 121g. However, the present disclosure is not limited thereto. However, in a case in which the additional line 275 serves as the hydrogen adsorption layer, the additional line 275 may be made of metal such as Ti having a hydrogen adsorption ability or a Ti alloy such as Ti/Al/Ti.

In addition, the materials constituting the additional line 275 may include Sc, V, Mn, Fe, Pd, Nb, Zr, Y, Ta, Ce, La, Sm, U, and the like, which are excellent in hydrogen adsorption ability, in addition to Ti.

The additional line 275 may be any one of the data line, the high-potential power line, the initialization signal line, the scan line, the sensing line, the low-potential power line, and the ground voltage line. However, the present disclosure is not limited thereto.

The additional line 275 disposed on the substrate 111 in the non-display area NA may extend to the GIP area GA and/or the display area AA through the dams 260a and 260b. The additional line 275 may be electrically connected to various types of lines or electrodes in the GIP area GA and/or the display area AA through a jumping structure or the like.

The trench pattern T is not present in the region (see FIG. 10A) in which the additional line 275 is disposed. The trench pattern T is present in the region (see FIG. 10B) in which the additional line 275 is not disposed. Therefore, the trench pattern T may be disposed to surround the display area AA in a state in which the trench pattern T is divided into a plurality of pieces, as a whole.

In this case, in the second aspect of the present disclosure, the trench pattern T is formed by removing the second and third buffer layers 113 and 114, the gate insulating layer 115, the first interlayer insulating layer 116, and the second interlayer insulating layer 117 between the first dam 260a and second dam 260b in the dam area DA in which the additional line 275 is not disposed. However, the present disclosure is not limited thereto, and the trench pattern T may be formed by removing at least one insulating layer, sequentially from the top side, among the second and third buffer layers 113 and 114, the gate insulating layer 115, the first interlayer insulating layer 116, and the second interlayer insulating layer 117 between the first dam 260a and the second dam 260b in the area in which the additional line 275 is not disposed.

An undercut UC may be formed in the trench pattern T by a selective etching process.

The dams 260a and 260b according to the second aspect of the present disclosure may be disposed in the dam area DA.

The dams 260a and 260b may be configured by the first and second planarization layers 118a and 118b and the bank 119 and each have a trapezoidal shape having a top surface narrower than a bottom surface. However, the present disclosure is not limited thereto.

In the dams 260a and 260b, the first hydrogen adsorption layers 161 are disposed on the second interlayer insulating layer 117, and the second hydrogen adsorption layers 162 are disposed on the first planarization layer 118a. However, the present disclosure is not limited thereto.

In addition, the third hydrogen adsorption layer 137 may be disposed on the first planarization layer 118a in the GIP area GA.

The first, second, and third hydrogen adsorption layers 161, 162, and 137 may each be made of metal such as Ti having a hydrogen adsorption ability or a Ti alloy such as Ti/Al/Ti.

The materials constituting the first, second, and third hydrogen adsorption layers 161, 162, and 137 may include Sc, V, Mn, Fe, Pd, Nb, Zr, Y, Ta, Ce, La, Sm, U, and the like, which are excellent in hydrogen adsorption ability, in addition to Ti.

The first, second, and third hydrogen adsorption layers 161, 162, and 137 may be used as various types of lines or electrodes while suppressing the diffusion of hydrogen.

As described above, in the second aspect of the present disclosure, the additional line 275 may be disposed on the gate electrode layer below the dams 260a and 260b and used as a hydrogen absorption layer, thereby more effectively suppressing the penetration of outside moisture and inhibiting hydrogen from entering the oxide thin-film transistor.

In addition, the second aspect of the present disclosure is characterized in that the buffer layer 140 made of silicon nitride is formed on the bank 119 and the dams 260a and 260b.

The buffer layer 140 may be disposed on the second interlayer insulating layer 117 and the dams 260a and 260b in the non-display area NA and on the bank 119 except for the opening portion OP.

The buffer layer 140 may be disposed on side surfaces and top surfaces of the dams 260a and 260b except for the trench pattern T. However, the present disclosure is not limited thereto. In the region in which the additional line 275 is disposed (see FIG. 10A), the buffer layer 140 may also be disposed between the first dam 260a and the second dam 260b.

In the second aspect of the present disclosure, the buffer layer 140 may suppress the diffusion of moisture or hydrogen introduced from the outside or the top side, thereby improving characteristics and reliability of the oxide thin-film transistors 120 and 120g.

Meanwhile, the additional line according to the present disclosure may be disposed on a source/drain electrode layer and/or an intermediate electrode layer in addition to the gate electrode layer. This configuration will be described with reference to FIGS. 11 and 12.

Figure 11:
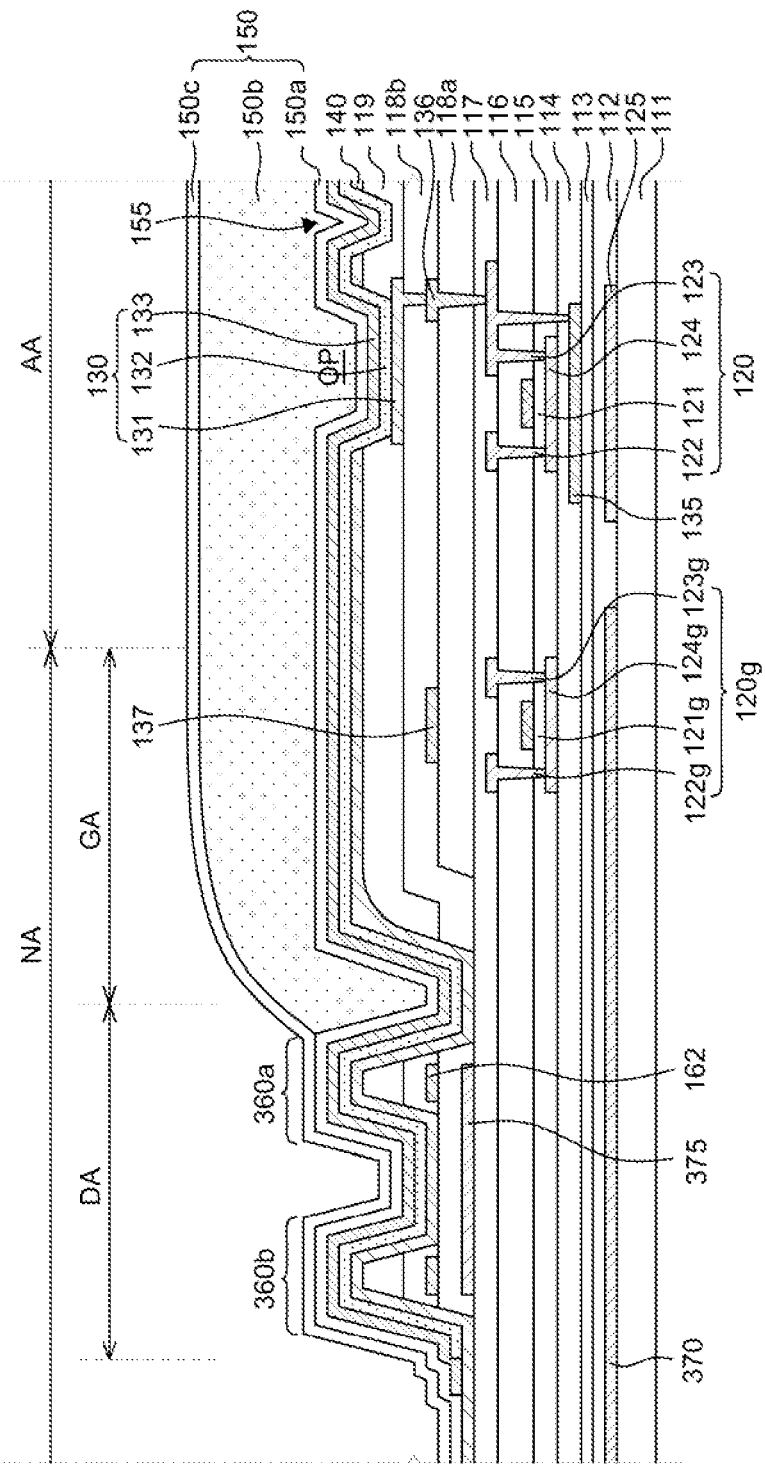
FIG. 11 is a cross-sectional view of a display panel according to a third aspect of the present disclosure.

FIG. 11 is a cross-sectional view of a display panel according to a third aspect of the present disclosure.

The third aspect illustrated in FIG. 11 is substantially identical in configuration to the second aspect illustrated in FIGS. 9, 10A, and 10B but differs from the second aspect in that an additional line 375 is disposed on a source/drain electrode layer below a dams 360a and 360b. Therefore, repeated descriptions of the identical components will be omitted. The same reference numerals are used for the same components.

FIG. 11 illustrates a part of a cross-section of the display panel PN according to the third aspect of the present disclosure including the GIP area GA and the dam area DA. In particular, FIG. 11 illustrates a part of a cross-section of the display panel PN in which the additional line 375 is disposed on the source/drain electrode layer below the dams 360a and 360b. A part of a cross-section of the display panel PN in which the additional line 375 is not disposed below the dams 360a and 360b is not illustrated because this part is substantially identical to that illustrated in FIG. 10B.

Referring to FIG. 11, an electroluminescent display device according to the third aspect of the present disclosure may include the display panel PN including the display area AA and the non-display area NA.

The non-display area NA may include the GIP area GA and the dam area DA.

The plurality of dams 360a and 360b including the first dam 360a disposed at the inside and the second dam 360b disposed at the outside may be disposed in the dam area DA. However, the present disclosure is not limited thereto.

A main line 370 may be disposed on the substrate 111 in the non-display area NA.

The main line 370 may be disposed on the same layer and made of the same metal as the first light-blocking layer 125, but the present disclosure is not limited thereto. The main line 370 may be any one of the data line, the high-potential power line, and the initialization signal line. However, the present disclosure is not limited thereto.

The main line 370 disposed on the substrate 111 in the non-display area NA may extend to the GIP area GA and/or the display area AA through the dams 360a and 360b. The main line 370 may be electrically connected to various types of lines or electrodes in the GIP area GA and/or the display area AA through a jumping structure or the like.

Meanwhile, an auxiliary line may be disposed on the substrate 111 in the non-display area NA.

The auxiliary line may be disposed on the same layer and made of the same metal as the first light-blocking layer 125. However, the present disclosure is not limited thereto. The auxiliary line may be any one of the scan line, the sensing line, the low-potential power line, and the ground voltage line. However, the present disclosure is not limited thereto.

The auxiliary line disposed on the substrate 111 in the non-display area NA may extend to the GIP area GA and/or the display area AA through the dams 360a and 360b. The auxiliary line may be electrically connected to various types of lines or electrodes in the GIP area GA and/or the display area AA through a jumping structure or the like.

FIG. 11 illustrates an example in which the main line 370 passes through the lower sides of the dams 360a and 360b. However, the present disclosure is not limited thereto. The main line 370 may pass through one partial region, and the auxiliary line may pass through another partial region.

The additional line 375 may be disposed on the second interlayer insulating layer 117 in the non-display area NA.

The additional line 375 may be disposed on the same layer and made of the same metal as the source electrodes 122 and 122g and the drain electrodes 123 and 123g. However, the present disclosure is not limited thereto. In a case in which the additional line 375 serves as the hydrogen adsorption layer, the additional line 375 may be made of metal such as Ti having a hydrogen adsorption ability or a Ti alloy such as Ti/Al/Ti. In this case, it is possible to more effectively suppress the penetration of outside moisture and inhibit hydrogen from entering the oxide thin-film transistor.

In addition, the materials constituting the additional line 375 may include Sc, V, Mn, Fe, Pd, Nb, Zr, Y, Ta, Ce, La, Sm, U, and the like, which are excellent in hydrogen adsorption ability, in addition to Ti.

The additional line 375 may be any one of the data line, the high-potential power line, the initialization signal line, the scan line, the sensing line, the low-potential power line, and the ground voltage line. However, the present disclosure is not limited thereto. However, in a case in which the additional line 375 is provided in the dams 360a and 360b and disposed along the dams 360a and 360b, the additional line 375 may be any one of the scan line, the sensing line, the low-potential power line, and the ground voltage line, like the auxiliary line. However, the present disclosure is not limited thereto.

The additional line 375 disposed on the substrate 111 in the non-display area NA may extend to the GIP area GA and/or the display area AA through the dams 360a and 360b. The additional line 375 may be electrically connected to various types of lines or electrodes in the GIP area GA and/or the display area AA through a jumping structure.

The trench pattern is not present in the region (see FIG. 11) in which the additional line 375 is disposed. The trench pattern is present in the region in which the additional line 375 is not disposed. Therefore, the trench pattern may be disposed to surround the display area AA in a state in which the trench pattern is divided into a plurality of pieces, as a whole.

In this case, in the third aspect of the present disclosure, the trench pattern is formed by removing the second and third buffer layers 113 and 114, the gate insulating layer 115, the first interlayer insulating layer 116, and the second interlayer insulating layer 117 between the first dam 360a and second dam 360b in the dam area DA in which the additional line 375 is not disposed. However, the present disclosure is not limited thereto, and the trench pattern may be formed by removing at least one insulating layer, sequentially from the top side, among the second and third buffer layers 113 and 114, the gate insulating layer 115, the first interlayer insulating layer 116, and the second interlayer insulating layer 117 between the first dam 360a and the second dam 360b in the area in which the additional line 375 is not disposed.

An undercut may be formed in the trench pattern by a selective etching process.

The dams 360a and 360b according to the third aspect of the present disclosure may be disposed in the dam area DA.

The dams 360a and 360b may be configured by the first and second planarization layers 118a and 118b and the bank 119 and each have a trapezoidal shape having a top surface narrower than a bottom surface. However, the present disclosure is not limited thereto.

In the dams 360a and 360b, a first hydrogen adsorption layer (not illustrated) may be disposed on the second interlayer insulating layer 117, and the second hydrogen adsorption layers 162 may be disposed on the first planarization layer 118a. However, the present disclosure is not limited thereto. The first hydrogen adsorption layer may be disposed in the first and second dams 360a and 360b in the dam area DA in which the additional line 375 is not disposed.

In addition, the third hydrogen adsorption layer 137 may be disposed on the first planarization layer 118a in the GIP area GA.

The first, second, and third hydrogen adsorption layers 162 and 137 may each be made of metal such as Ti having a hydrogen adsorption ability or a Ti alloy such as Ti/Al/Ti.

The materials constituting the first, second, and third hydrogen adsorption layers 162 and 137 may include Sc, V, Mn, Fe, Pd, Nb, Zr, Y, Ta, Ce, La, Sm, U, and the like, which are excellent in hydrogen adsorption ability, in addition to Ti.

The first, second, and third hydrogen adsorption layers 162 and 137 may be used as various types of lines or electrodes while suppressing the diffusion of hydrogen.

In addition, the third aspect of the present disclosure is characterized in that the buffer layer 140 made of silicon nitride is formed on the bank 119 and the dams 360a and 360b.

The buffer layer 140 may be disposed on the second interlayer insulating layer 117 and the dams 360a and 360b in the non-display area NA and on the bank 119 except for the opening portion OP.

The buffer layer 140 may be disposed on side surfaces and top surfaces of the dams 360a and 360b except for the trench pattern. However, the present disclosure is not limited thereto. In the region in which the additional line 375 is disposed, the buffer layer 140 may also be disposed between the first dam 360a and the second dam 360b.

Figure 12:
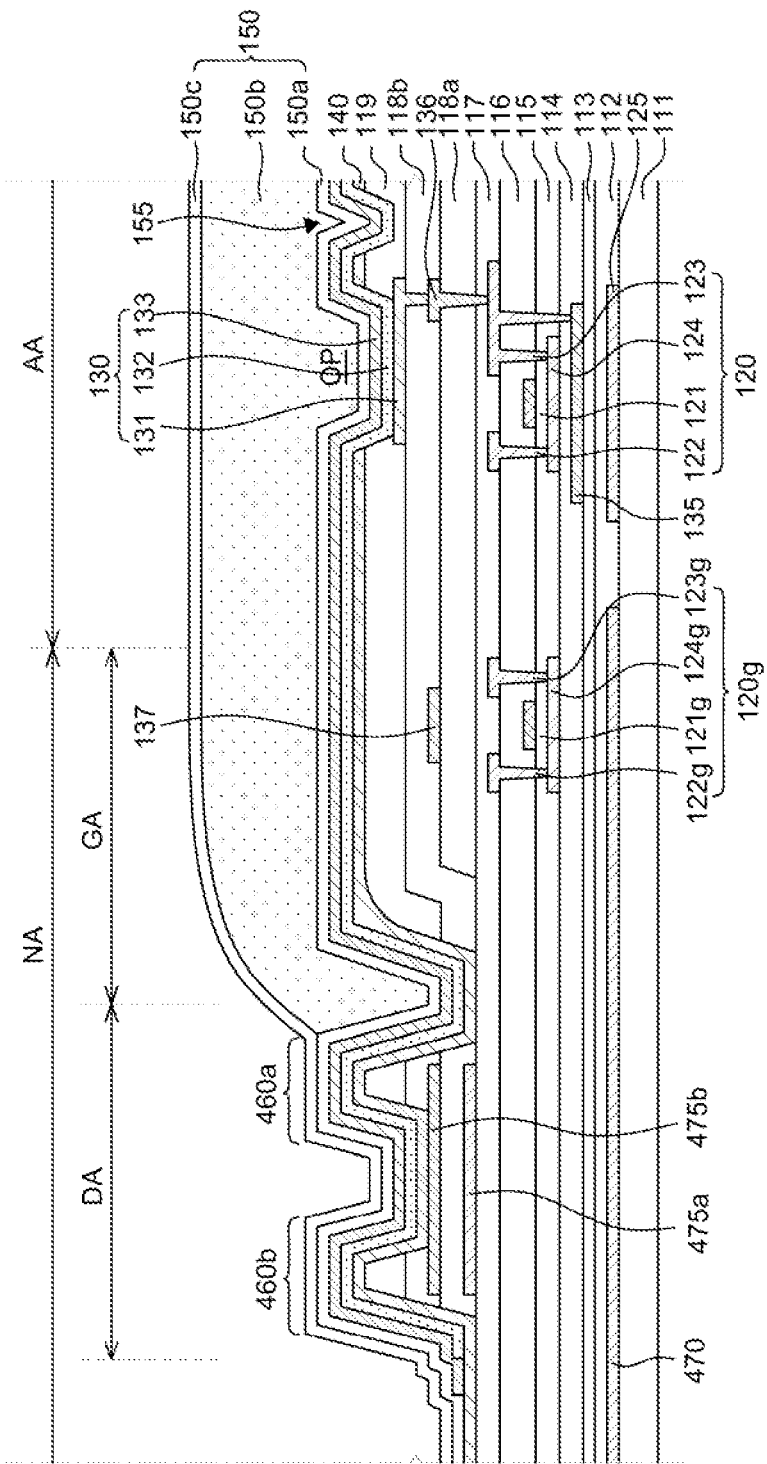
FIG. 12 is a cross-sectional view of a display panel according to a fourth aspect of the present disclosure.

FIG. 12 is a cross-sectional view of a display panel according to a fourth aspect of the present disclosure.

The fourth aspect illustrated in FIG. 12 is substantially identical in configuration to the third aspect illustrated in FIG. 11 but differs from the third aspect in that additional lines 475a and 475b are disposed on an intermediate electrode layer as well as the source/drain electrode layer below the dams 460a and 460b. Therefore, repeated descriptions of the identical components will be omitted. The same reference numerals are used for the same components.

FIG. 12 illustrates a part of a cross-section of the display panel PN according to the fourth aspect of the present disclosure including the GIP area GA and the dam area DA. In particular, FIG. 12 illustrates a part of a cross-section of the display panel PN in which the additional lines 475a and 475b are disposed on the intermediate electrode layer and the source/drain electrode layer below the dams 460a and 460b. A part of a cross-section of the display panel PN in which the additional lines 475a and 475b are not disposed below the dams 460a and 460b is not illustrated because this part is substantially identical to that illustrated in FIG. 10B.

Referring to FIG. 12, an electroluminescent display device according to the fourth aspect of the present disclosure may include the display panel PN including the display area AA and the non-display area NA.

The non-display area NA may include the GIP area GA and the dam area DA.

The plurality of dams 460a and 460b including the first dam 460a disposed at the inside and the second dam 460b disposed at the outside may be disposed in the dam area DA. However, the present disclosure is not limited thereto.

A main line 470 may be disposed on the substrate 111 in the non-display area NA.

The main line 470 may be disposed on the same layer and made of the same metal as the first light-blocking layer 125, but the present disclosure is not limited thereto. The main line 470 may be any one of the data line, the high-potential power line, and the initialization signal line. However, the present disclosure is not limited thereto.

The main line 470 disposed on the substrate 111 in the non-display area NA may extend to the GIP area GA and/or the display area AA through the dams 460a and 460b. The main line 470 may be electrically connected to various types of lines or electrodes in the GIP area GA and/or the display area AA through a jumping structure or the like.

Meanwhile, an auxiliary line may be disposed on the substrate 111 in the non-display area NA.

The auxiliary line may be disposed on the same layer and made of the same metal as the first light-blocking layer 125. However, the present disclosure is not limited thereto. The auxiliary line may be any one of the scan line, the sensing line, the low-potential power line, and the ground voltage line. However, the present disclosure is not limited thereto.

The auxiliary line disposed on the substrate 111 in the non-display area NA may extend to the GIP area GA and/or the display area AA through the dams 460a and 460b. The auxiliary line may be electrically connected to various types of lines or electrodes in the GIP area GA and/or the display area AA through a jumping structure or the like.

FIG. 12 illustrates an example in which the main line 470 passes through the lower sides of the dams 460a and 460b. However, the present disclosure is not limited thereto. The main line 470 may pass through one partial region, and the auxiliary line may pass through another partial region.

A first additional line 475a may be disposed on the second interlayer insulating layer 117 in the non-display area NA.

The first additional line 475a may be disposed on the same layer and made of the same metal as the source electrodes 122 and 122g and the drain electrodes 123 and 123g. However, the present disclosure is not limited thereto.

In addition, a second additional line 475b may be disposed on the first planarization layer 118a in the non-display area NA.

The second additional line 475b may be disposed on the same layer and made of the same metal as the intermediate electrode 136. However, the present disclosure is not limited thereto.

In a case in which the first additional line 475a and the second additional line 475b serve as hydrogen adsorption layers, the first additional line 475a and the second additional line 475b may be made of metal such as Ti having a hydrogen adsorption ability or a Ti alloy such as Ti/Al/Ti.

In this case, it is possible to more effectively suppress the penetration of outside moisture and inhibit hydrogen from entering the oxide thin-film transistor.

In addition, the materials constituting the first additional line 475a and the second additional line 475b may include Sc, V, Mn, Fe, Pd, Nb, Zr, Y, Ta, Ce, La, Sm, U, and the like, which are excellent in hydrogen adsorption ability, in addition to Ti.

The first additional line 475a and the second additional line 475b may each be any one of the data line, the high-potential power line, the initialization signal line, the scan line, the sensing line, the low-potential power line, and the ground voltage line. However, the present disclosure is not limited thereto. However, in a case in which the first additional line 475a and the second additional line 475b are provided in the dams 460a and 460b and disposed along the dams 460a and 460b, the first additional line 475a and the second additional line 475b may each be any one of the scan line, the sensing line, the low-potential power line, and the ground voltage line, like the auxiliary line. However, the present disclosure is not limited thereto. As described above, the first additional line 475a is disposed on the second interlayer insulating layer 117, and the second additional line 475b is disposed on the first planarization layer 118a, such that the first additional line 475a and the second additional line 475b are used as lines. Therefore, it is possible to reduce an area in which the lines are disposed, thereby reducing a bezel width and decreasing resistance through connection with the existing line.

The first additional line 475a and the second additional line 475b disposed on the substrate 111 in the non-display area NA may extend to the GIP area GA and/or the display area AA through the dams 460a and 460b. The first additional line 475a and the second additional line 475b may be electrically connected to various types of lines or electrodes in the GIP area GA and/or the display area AA through a jumping structure.

The trench pattern is not present in the region (see FIG. 12) in which the first additional line 475a and the second additional line 475b are disposed. The trench pattern is present in the region in which the first additional line 475a and the second additional line 475b are not disposed. Therefore, the trench pattern may be disposed to surround the display area AA in a state in which the trench pattern is divided into a plurality of pieces, as a whole.

In this case, in the fourth aspect of the present disclosure, the trench pattern is formed by removing the second and third buffer layers 113 and 114, the gate insulating layer 115, the first interlayer insulating layer 116, and the second interlayer insulating layer 117 between the first dam 460a and second dam 460b in the dam area DA in which the first additional line 475a and the second additional line 475b are not disposed. However, the present disclosure is not limited thereto, and the trench pattern may be formed by removing at least one insulating layer, sequentially from the top side, among the second and third buffer layers 113 and 114, the gate insulating layer 115, the first interlayer insulating layer 116, and the second interlayer insulating layer 117 between the first dam 460a and the second dam 460b in the area in which the first additional line 475a and the second additional line 475b are not disposed.

An undercut may be formed in the trench pattern by a selective etching process.

The dams 460a and 460b according to the fourth aspect of the present disclosure may be disposed in the dam area DA.

The dams 460a and 460b may be configured by the first and second planarization layers 118a and 118b and the bank 119 and each have a trapezoidal shape having a top surface narrower than a bottom surface. However, the present disclosure is not limited thereto.

In the dams 460a and 460b, a first hydrogen adsorption layer (not illustrated) may be disposed on the second interlayer insulating layer 117, and a second hydrogen adsorption layers (not illustrated) may be disposed on the first planarization layer 118a. However, the present disclosure is not limited thereto. That is, the first and second hydrogen adsorption layers may be disposed in the dams 460a and 460b in which the first and second additional lines 475a and 475b are not disposed.

In addition, the third hydrogen adsorption layer 137 may be disposed on the first planarization layer 118a in the GIP area GA.

The first, second, and third hydrogen adsorption layers 137 may each be made of metal such as Ti having a hydrogen adsorption ability or a Ti alloy such as Ti/Al/Ti.

The materials constituting the first, second, and third hydrogen adsorption layers 137 may include Sc, V, Mn, Fe, Pd, Nb, Zr, Y, Ta, Ce, La, Sm, U, and the like, which are excellent in hydrogen adsorption ability, in addition to Ti.

The first, second, and third hydrogen adsorption layers 137 may be used as various types of lines or electrodes while suppressing the diffusion of hydrogen.

The fourth aspect of the present disclosure is characterized in that the buffer layer 140 made of silicon nitride is formed on the bank 119 and the dams 460a and 460b.

The buffer layer 140 may be disposed on the second interlayer insulating layer 117 and the dams 460a and 460b in the non-display area NA and on the bank 119 except for the opening portion OP.

The buffer layer 140 may be disposed on side surfaces and top surfaces of the dams 460a and 460b except for the trench pattern. However, the present disclosure is not limited thereto. In the region in which the first and second additional lines 475a and 475b are disposed, the buffer layer 140 may also be disposed between the first dam 460a and the second dam 460b.

Meanwhile, the arrangement direction of the lines may vary depending on the upper position, the lower position, the left position, and the right position of the display panel. This configuration will be described with reference to FIGS. 13 to 15A and 15B.

Figure 13:
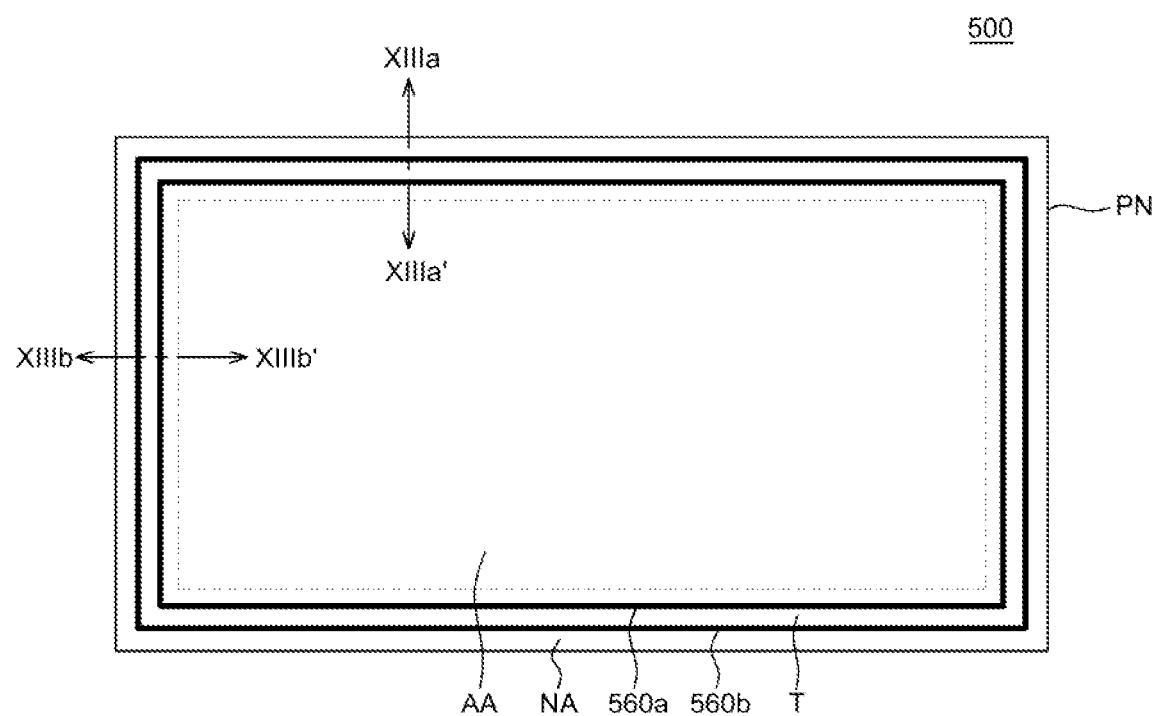
FIG. 13 is a top plan view of an electroluminescent display device according to the fifth aspect of the present disclosure.

FIG. 13 is a top plan view of an electroluminescent display device according to the fifth aspect of the present disclosure.

Figure 14:
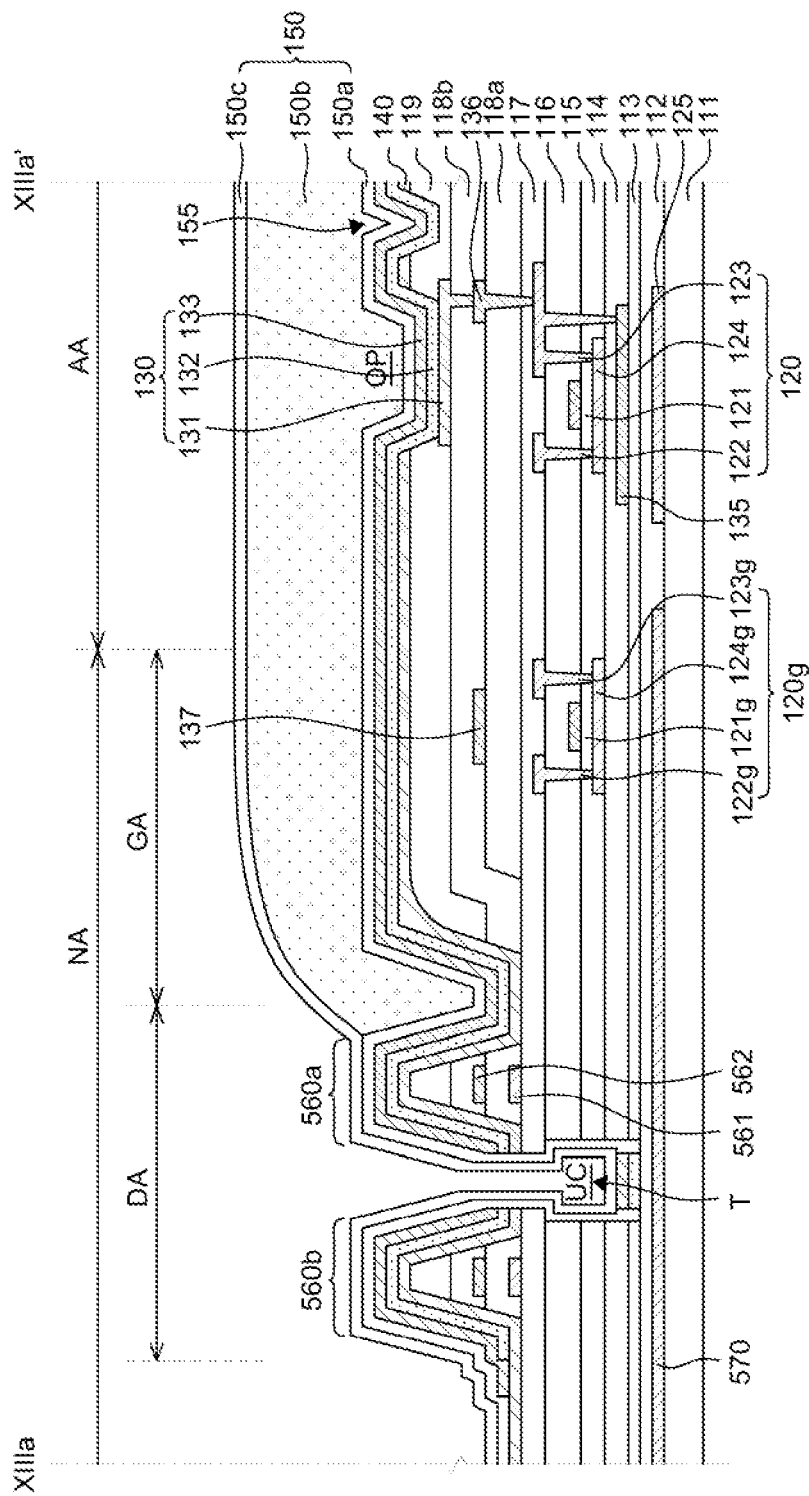
FIG. 14 is a cross-sectional view taken along line XIIIa-XIIIa' in FIG. 13.

FIG. 14 is a cross-sectional view taken along line XIIIa-XIIIa' in FIG. 13.

Figure 15A:
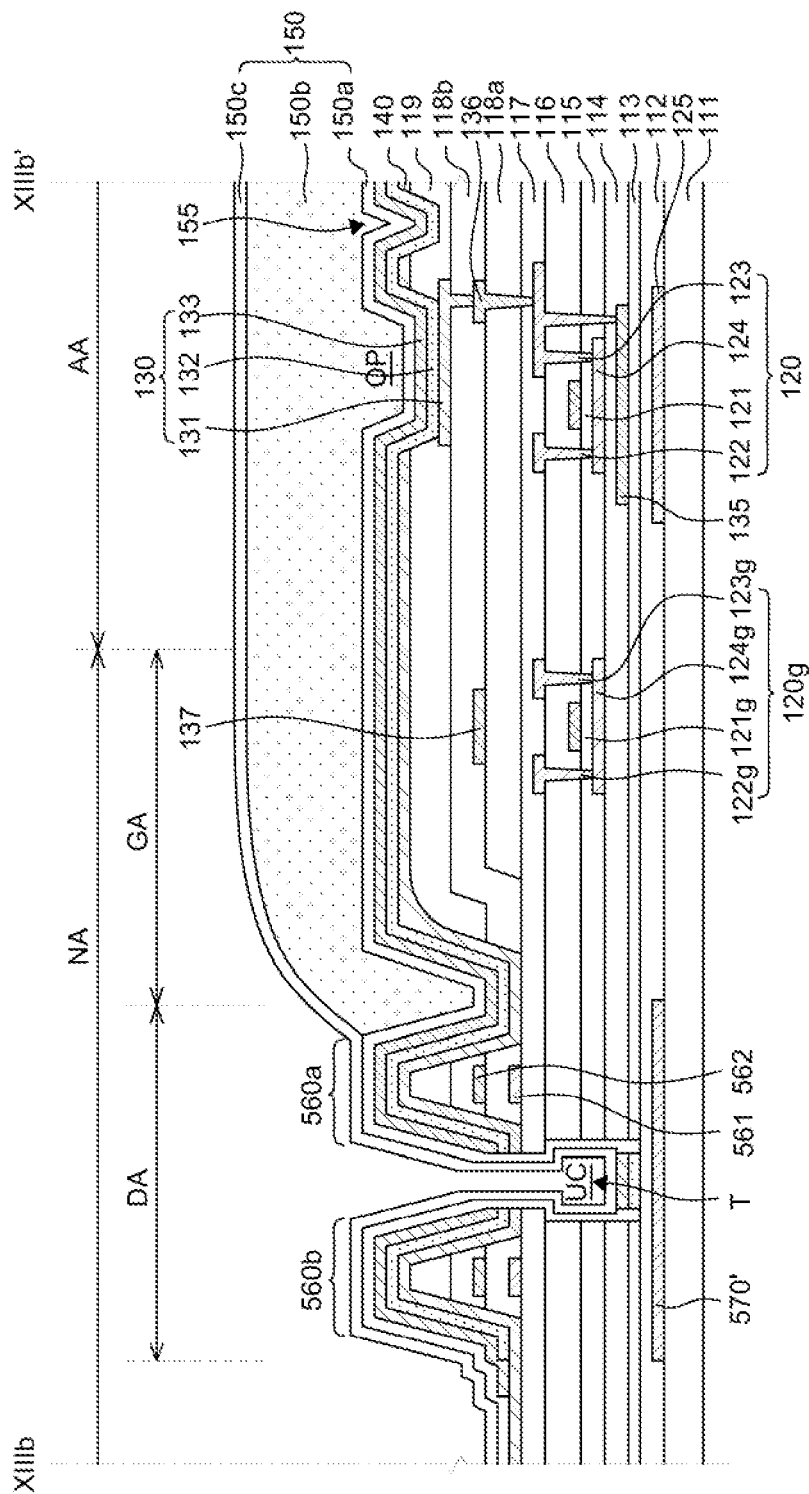
FIGS. 15A and 15B are cross-sectional views taken along line XIIIb-XIIIb' in FIG. 13.
Figure 15B:
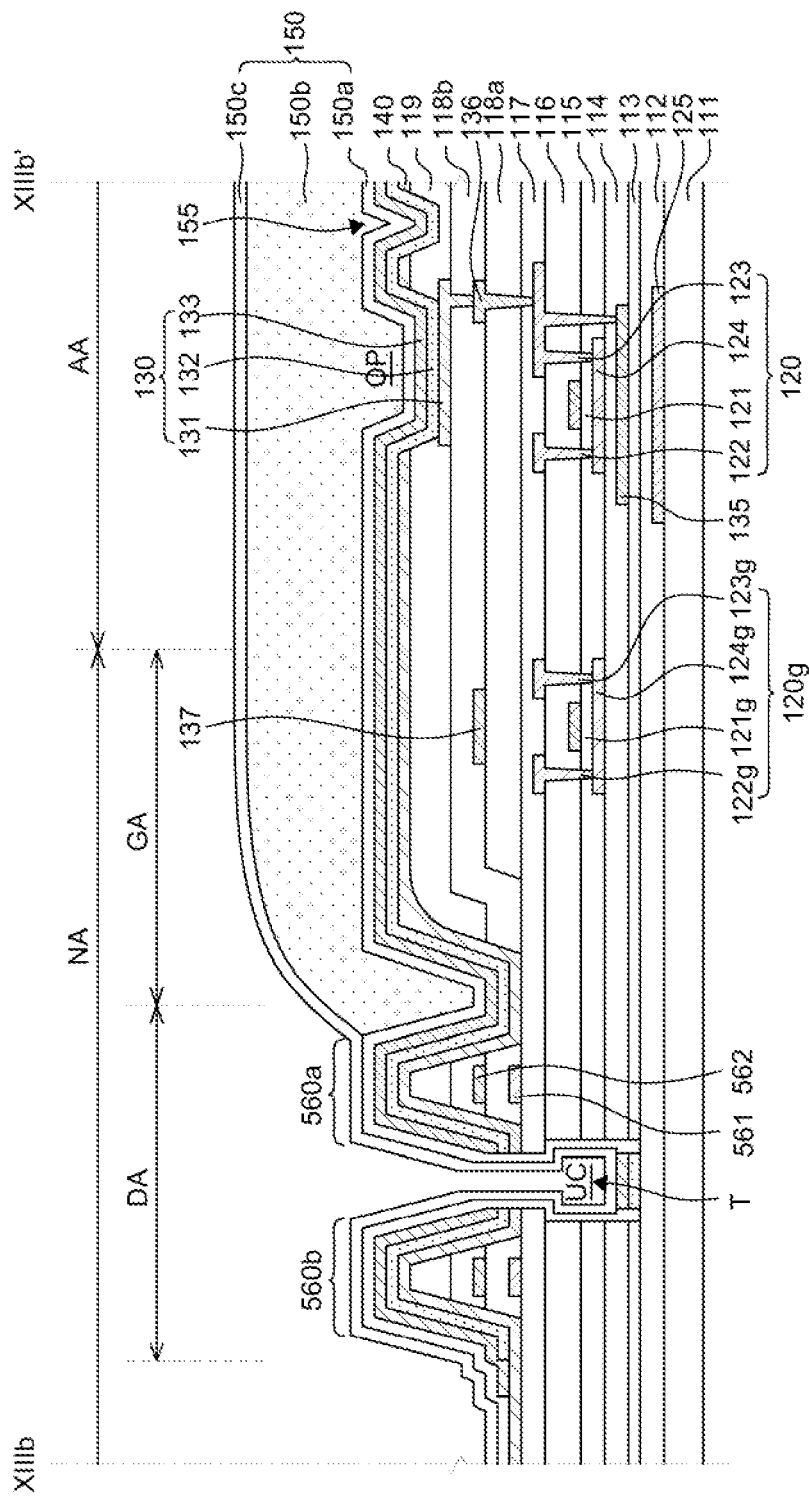

FIGS. 15A and 15B are cross-sectional views taken along line XIIIb-XIIIb' in FIG. 13.

The fifth aspect illustrated in FIGS. 13 to 15A and 15B is substantially identical in configuration to the first aspect illustrated in FIGS. 3 to 6 but differs from the first aspect in terms of a positional relationship between lines 570 and 570'. Therefore, repeated descriptions of the identical components will be omitted. The same reference numerals are used for the same components.

FIGS. 14, 15A, and 15B each illustrate a part of a cross-section of the display panel PN according to the fifth aspect of the present disclosure including the GIP area GA and the dam area DA. In particular, FIG. 14 illustrates a part of a cross-section of the upper and lower sides of the display panel PN in which a main line 570 is disposed below dams 560a and 560b. In addition, FIG. 15A illustrates a part of a cross-section of the left and right sides of the display panel PN in which an auxiliary line 570' is disposed below the dams 560a and 560b. FIG. 15B illustrates a part of a cross-section of the left and right sides of the display panel PN in which the auxiliary line 570' is not disposed below the dams 560a and 560b.

Referring to FIGS. 13 to 15A and 15B, an electroluminescent display device 500 according to the fifth aspect of the present disclosure may include the display panel PN including the display area AA and the non-display area NA.

The non-display area NA may include the GIP area GA and the dam area DA.

The plurality of dams 560a and 560b including the first dam 560a disposed at the inside and the second dam 560b disposed at the outside may be disposed in the dam area DA. However, the present disclosure is not limited thereto.

A main line 570 may be disposed on the substrate 111 in the non-display area NA.

The main line 570 may be disposed on the same layer and made of the same metal as the first light-blocking layer 125, but the present disclosure is not limited thereto.

The main line 570 is a line passing through the lower sides of the dams 560a and 560b in a direction perpendicular to or oblique with respect to the arrangement direction of the dams 560a and 560b. The main line 570 may be mainly disposed at an upper or lower side of the display panel PN. Therefore, the main line 570 may be any one of the data line, the high-potential power line, and the initialization signal line. However, the present disclosure is not limited thereto.

The main line 570 disposed on the substrate 111 in the non-display area NA may extend to the GIP area GA and/or the display area AA through the dams 560a and 560b. The main line 570 may be electrically connected to various types of lines or electrodes in the GIP area GA and/or the display area AA through a jumping structure or the like.

Meanwhile, the auxiliary line 570' may be disposed on the substrate 111 in the non-display area NA.

The auxiliary line 570' may be disposed on the same layer and made of the same metal as the first light-blocking layer 125. However, the present disclosure is not limited thereto.

The auxiliary line 570' is a line provided below the dams 560a and 560b and disposed in a direction substantially parallel to the arrangement direction of the dams 560a and 560b. The auxiliary line 570' may be mainly disposed at a left or right side of the display panel PN. Therefore, the auxiliary line 570' may be any one of the scan line, the sensing line, the low-potential power line, and the ground voltage line. However, the present disclosure is not limited thereto.

The auxiliary line 570' disposed on the substrate 111 in the non-display area NA may extend to the GIP area GA and/or the display area AA through the dams 560a and 560b. The auxiliary line 570' may be electrically connected to various types of lines or electrodes in the GIP area GA and/or the display area AA through a jumping structure or the like.

However, the present disclosure is not limited to the above-mentioned arrangement of the main line 570 and the auxiliary line 570'. Regardless of the position of the display panel PN, the main line 570 may be disposed in one part of the dam area DA, and the auxiliary line 570' may be disposed in another part of the dam area DA.

As described above, in the fifth aspect of the present disclosure, the main line 570 or the auxiliary line 570' is appropriately disposed below the dams 560a and 560b depending on the position of the display panel PN. Therefore, the line can be more effectively disposes and a bezel width can be minimized.

In addition, although not illustrated, a first additional line may be disposed on the second interlayer insulating layer 117 in the non-display area NA, and a second additional line may be disposed on the first planarization layer 118a in the non-display area NA.

The first additional line may be disposed on the same layer and made of the same metal as the source electrodes 122 and 122g and the drain electrodes 123 and 123g. However, the present disclosure is not limited thereto.

The second additional line may be disposed on the same layer and made of the same metal as the intermediate electrode 136. However, the present disclosure is not limited thereto.

In a case in which the first additional line and the second additional line serve as hydrogen adsorption layers, the first additional line and the second additional line may be made of metal such as Ti having a hydrogen adsorption ability or a Ti alloy such as Ti/Al/Ti.

In addition, the materials constituting the first additional line and the second additional line may include Sc, V, Mn, Fe, Pd, Nb, Zr, Y, Ta, Ce, La, Sm, U, and the like, which are excellent in hydrogen adsorption ability, in addition to Ti.

The first additional line and the second additional line may each be any one of the data line, the high-potential power line, the initialization signal line, the scan line, the sensing line, the low-potential power line, and the ground voltage line. However, the present disclosure is not limited thereto. However, in a case in which the first additional line and the second additional line are provided in the dams 560a and 560b and disposed along the dams 560a and 560b, the first additional line and the second additional line may each be any one of the scan line, the sensing line, the low-potential power line, and the ground voltage line, like the auxiliary line. However, the present disclosure is not limited thereto.

The first additional line and the second additional line disposed on the substrate 111 in the non-display area NA may extend to the GIP area GA and/or the display area AA through the dams 560a and 560b. The first additional line and the second additional line may be electrically connected to various types of lines or electrodes in the GIP area GA and/or the display area AA through a jumping structure.

The trench pattern T is not present in the region in which the first additional line and the second additional line are disposed. The trench pattern T is present in the region in which the first additional line and the second additional line are not disposed. Therefore, the trench pattern T may be disposed to surround the display area AA in a state in which the trench pattern is divided into a plurality of pieces, as a whole.

In the fifth aspect of the present disclosure, the trench pattern T is formed by removing the second and third buffer layers 113 and 114, the gate insulating layer 115, the first interlayer insulating layer 116, and the second interlayer insulating layer 117 between the first dam 560a and second dam 560b in the dam area DA in which the first additional line and the second additional line are not disposed. However, the present disclosure is not limited thereto, and the trench pattern T may be formed by removing at least one insulating layer, sequentially from the top side, among the second and third buffer layers 113 and 114, the gate insulating layer 115, the first interlayer insulating layer 116, and the second interlayer insulating layer 117 between the first dam 560a and the second dam 560b in the area in which the first additional line and the second additional line are not disposed.

An undercut UC may be formed in the trench pattern T by a selective etching process.

The dams 560a and 560b according to the fifth aspect of the present disclosure may be disposed in the dam area DA.

The dams 560a and 560b may be configured by the first and second planarization layers 118a and 118b and the bank 119 and each have a trapezoidal shape having a top surface narrower than a bottom surface. However, the present disclosure is not limited thereto.

In the dams 560a and 560b, first hydrogen adsorption layers 561 are disposed on the second interlayer insulating layer 117, and second hydrogen adsorption layers 562 are disposed on the first planarization layer 118a. However, the present disclosure is not limited thereto. That is, the first and second hydrogen adsorption layers 561, 562 may be disposed in the dams 560a and 560b in which the first and second additional lines are not disposed.

In addition, a third hydrogen adsorption layer 137 may be disposed on the first planarization layer 118a in the GIP area GA.

The first, second, and third hydrogen adsorption layers 561, 562, and 137 may each be made of metal such as Ti having a hydrogen adsorption ability or a Ti alloy such as Ti/Al/Ti.

The materials constituting the first, second, and third hydrogen adsorption layers 561, 562, and 137 may include Sc, V, Mn, Fe, Pd, Nb, Zr, Y, Ta, Ce, La, Sm, U, and the like, which are excellent in hydrogen adsorption ability, in addition to Ti.

The first, second, and third hydrogen adsorption layers 561, 562, and 137 may be used as various types of lines or electrodes while suppressing the diffusion of hydrogen.

The fifth aspect of the present disclosure is characterized in that the buffer layer 140 made of silicon nitride is formed on the bank 119 and the dams 560a and 560b.

The buffer layer 140 may be disposed on the second interlayer insulating layer 117 and the dams 560a and 560b in the non-display area NA and on the bank 119 except for the opening portion OP.

The buffer layer 140 may be disposed on side surfaces and top surfaces of the dams 560a and 560b except for the trench pattern T. However, the present disclosure is not limited thereto. In the region in which the additional line is disposed, the buffer layer 140 may also be disposed between the first dam 560a and the second dam 560b.

The exemplary aspects of the present disclosure can also be described as follows:

According to an aspect of the present disclosure, there is provided an electroluminescent display device. The electroluminescent display device includes a substrate comprising a display area and a non-display area including a gate-in-panel (GIP) area disposed outside the display area, an oxide thin-film transistor disposed above the substrate, a planarization layer disposed above the oxide thin-film transistor, an anode disposed above the planarization layer, a bank disposed above the planarization layer and including an opening portion through which a part of the anode is exposed, a plurality of dams disposed outside the GIP area and configured by the planarization layer and the bank, a buffer layer disposed above the bank and the dam and made of silicon nitride, a light-emitting part disposed on the exposed anode and the buffer layer and a cathode disposed on the light-emitting part.

The electroluminescent display device may further include a hydrogen adsorption layer disposed in the plurality of dams.

The plurality of dams may include a first dam disposed at the inside and a second dam disposed at the outside, and the dam may have a trapezoidal shape having a top surface narrower than a bottom surface.

A trench pattern may be configured by removing, sequentially from the top side, at least one insulating layer disposed below the planarization layer and provided between the first dam and the second dam, and the trench pattern may be disposed along the plurality of dams.

The electroluminescent display device may further include a sealing layer disposed above the cathode, wherein the sealing layer may include a primary protective film disposed above the cathode and configured as an inorganic insulating film, an organic film provided on the primary protective film and disposed at a portion before the first dam and a secondary protective film disposed on the organic film.

The primary protective film and the secondary protective film may extend to the non-display area and may be disposed on the GIP area and the plurality of dams including an inner surface of the trench pattern.

The buffer layer may be disposed on the bank, an interlayer insulating layer in the non-display area, and the plurality of dams.

The buffer layer may be disposed to adjoin side surfaces and top surfaces of the plurality of dams except for the trench pattern.

A display trench pattern may be configured by removing a part of a thickness of the buffer layer and a part of a thickness of the bank between the adjacent subpixels.

The electroluminescent display device may further include a second interlayer insulating layer disposed below the planarization layer and made of silicon nitride, a first interlayer insulating layer disposed below the second interlayer insulating layer and made of silicon oxide and an undercut disposed in the trench pattern and formed as the buffer layer and the second interlayer insulating layer protruding inward relative to the first interlayer insulating layer.

The electroluminescent display device may further include a light-blocking layer disposed below the oxide thin-film transistor and a main line and auxiliary line disposed on the substrate in the non-display area.

The main line and the auxiliary line may be disposed on the same layer as the light-blocking layer, the main line may include any one of a data line, a high-potential power line, and an initialization signal line, and the auxiliary line includes any one of a scan line, a sensing line, a low-potential power line, and a ground voltage line.

The main line and the auxiliary line may extend to the GIP area and/or the display area through the plurality of dams, the main line may pass through lower sides of the plurality of dams in a direction perpendicular to or oblique with respect to an arrangement direction of the plurality of dams, and the auxiliary line may be provided below the plurality of dams and disposed in a direction parallel to the arrangement direction of the plurality of dams.

The planarization layer may include a first planarization layer disposed on an interlayer insulating layer disposed above the oxide thin-film transistor and a second planarization layer disposed on the first planarization layer.

The electroluminescent display device may further include a hydrogen adsorption layer disposed on the interlayer insulating layer in the plurality of dams.

The hydrogen adsorption layer may include a first hydrogen adsorption layer disposed on the interlayer insulating layer in the plurality of dams and a second hydrogen adsorption layer disposed above the first hydrogen adsorption layer.

The hydrogen adsorption layer may further include a third hydrogen adsorption layer disposed on the first planarization layer in the GIP area.

The first, second, and third hydrogen adsorption layers may be made of Ti or a Ti alloy.

The light-emitting part and the cathode may be disposed on side surfaces and top surfaces of the plurality of dams and a bottom surface of the trench pattern except for an inner surface of the trench pattern.

The electroluminescent display device may further include an additional line disposed on a gate insulating layer in the non-display area, wherein the additional line may be any one of a data line, a high-potential power line, an initialization signal line, a scan line, a sensing line, a low-potential power line, and a ground voltage line, and wherein the additional line may extend to the GIP area and/or the display area through the plurality of dams.

The electroluminescent display device may further include an additional line disposed on the interlayer insulating layer in the non-display area, wherein the additional line may be provided in the plurality of dams and disposed along the plurality of dams, and the additional line may be any one of a scan line, a sensing line, a low-potential power line, and a ground voltage line, and wherein the additional line may extend to the GIP area and/or the display area through the plurality of dams through a jumping structure.

The additional line may be made of Ti or a Ti alloy.

The trench pattern may be not present in a region in which the additional line is disposed, wherein the trench pattern may be present in a region in which the additional line is not disposed, and wherein the trench pattern may be disposed to surround the display area in a state in which the trench pattern is divided into a plurality of pieces.

The electroluminescent display device may further include a first additional line disposed on the interlayer insulating layer in the non-display area and a second additional line disposed on the first planarization layer in the non-display area, wherein the first and second additional lines may be provided in the plurality of dams and disposed along the plurality of dams, and the first and second additional lines may be each any one of a scan line, a sensing line, a low-potential power line, and a ground voltage line, and wherein the first and second additional lines may extend to the GIP area and/or the display area through the plurality of dams through a jumping structure.

The first and second additional lines may be made of Ti or a Ti alloy.

The trench pattern may be not present in a region in which the first and second additional lines are disposed, wherein the trench pattern may be present in a region in which the first and second additional lines are not disposed, and wherein the trench pattern may be disposed to surround the display area in a state in which the trench pattern is divided into a plurality of pieces.

According to another aspect of the present disclosure, there is provided an electroluminescent display device. The electroluminescent display device includes a substrate comprising a display area and a non-display area disposed outside the display area, an oxide thin-film transistor disposed above the substrate, a planarization layer disposed above the oxide thin-film transistor, an anode disposed on the planarization layer, a bank disposed above the planarization layer and having an opening portion through which a part of the anode is exposed, first and second dams disposed in the non-display area and configured by the planarization layer and the bank, a trench pattern configured by removing an insulating layer on a lower portion of the planarization layer between the first and second dams, a buffer layer made of silicon nitride and disposed above the first and second dams except for the trench pattern and the bank except for the opening portion, a light-emitting part disposed on the exposed anode and the buffer layer and a cathode disposed on the light-emitting part.

Although the exemplary aspects of the present disclosure have been described in detail with reference to the accompanying drawings, the present disclosure is not limited thereto and may be embodied in many different forms without departing from the technical concept of the present disclosure. Therefore, the exemplary aspects of the present disclosure are provided for illustrative purposes only but not intended to limit the technical concept of the present disclosure. The scope of the technical concept of the present disclosure is not limited thereto. Therefore, it should be understood that the above-described exemplary aspects are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. An electroluminescent display device comprising:
   a substrate comprising a display area and a non-display area including a gate-in-panel (GIP) area disposed outside the display area;
   an oxide thin-film transistor disposed above the substrate;
   a planarization layer disposed above the oxide thin-film transistor;
   an anode disposed above the planarization layer;
   a bank disposed above the planarization layer and including an opening portion through which a part of the anode is exposed;
   a plurality of dams disposed outside the GIP area and configured by the planarization layer and the bank;
   a trench pattern between the plurality of dams;
   a buffer layer made of silicon nitride, extending from the display area and covering the plurality of dams excluding the trench pattern;
   a light-emitting part disposed on the part of the anode and the buffer layer; and
   a cathode disposed on the light-emitting part.

2. The electroluminescent display device of claim 1, further comprising a hydrogen adsorption layer disposed in the plurality of dams.

3. The electroluminescent display device of claim 1, wherein the plurality of dams comprises:
   a first dam; and
   a second dam disposed relatively outside the first dam and having a trapezoidal shape with a top surface narrower than a bottom surface.

4. The electroluminescent display device of claim 3, further comprising a trench pattern configured by removing at least one insulating layer disposed below the planarization layer and provided between the first dam and the second dam, and the trench pattern is disposed along the plurality of dams.

5. The electroluminescent display device of claim 4, further comprising a sealing layer disposed above the cathode,
   wherein the sealing layer comprises:
   a primary protective film disposed above the cathode and configured as an inorganic insulating film;
   an organic film provided on the primary protective film and disposed at a portion before the first dam; and
   a secondary protective film disposed on the organic film.

6. The electroluminescent display device of claim 5, wherein the primary protective film and the secondary protective film extend to the non-display area and are disposed on the GIP area and the plurality of dams including an inner surface of the trench pattern.

7. The electroluminescent display device of claim 4, wherein the buffer layer is disposed on the bank, an interlayer insulating layer in the non-display area, and the plurality of dams.

8. The electroluminescent display device of claim 7, wherein the buffer layer is disposed to adjoin side surfaces and top surfaces of the plurality of dams except for the trench pattern.

9. The electroluminescent display device of claim 7, further comprising an additional line disposed on the interlayer insulating layer in the non-display area,
   wherein the additional line is provided in the plurality of dams and disposed along the plurality of dams, and the additional line is any one of a scan line, a sensing line, a low-potential power line, and a ground voltage line, and
   wherein the additional line extends to the GIP area and/or the display area through the plurality of dams through a jumping structure.

10. The electroluminescent display device of claim 4, further comprising:
    a second interlayer insulating layer disposed below the planarization layer and made of silicon nitride;
    a first interlayer insulating layer disposed below the second interlayer insulating layer and made of silicon oxide; and
    an undercut disposed in the trench pattern and formed as the buffer layer and the second interlayer insulating layer protruding inward relative to the first interlayer insulating layer.

11. The electroluminescent display device of claim 4, wherein the light-emitting part and the cathode are disposed on side surfaces and top surfaces of the plurality of dams and a bottom surface of the trench pattern except for an inner surface of the trench pattern.

12. The electroluminescent display device of claim 4, further comprising an additional line disposed on a gate insulating layer in the non-display area,
    wherein the additional line is one of a data line, a high-potential power line, an initialization signal line, a scan line, a sensing line, a low-potential power line, and a ground voltage line, and
    wherein the additional line extends to the GIP area and/or the display area through the plurality of dams.

13. The electroluminescent display device of claim 12, wherein the additional line is made of Ti or a Ti alloy.

14. The electroluminescent display device of claim 13, wherein the trench pattern is not present in a region in which the additional line is disposed,
- wherein the trench pattern is present in a region in which the additional line is not disposed, and
- wherein the trench pattern is disposed to surround the display area in a state in which the trench pattern is divided into a plurality of pieces.

15. The electroluminescent display device of claim 1, wherein a display trench pattern is configured by removing a part of a thickness of the buffer layer and a part of a thickness of the bank between the adjacent subpixels.

16. The electroluminescent display device of claim 1, further comprising:
- a light-blocking layer disposed below the oxide thin-film transistor; and
- a main line and auxiliary line disposed on the substrate in the non-display area.

17. The electroluminescent display device of claim 16, wherein the main line and the auxiliary line are disposed on a same layer as the light-blocking layer, and
- wherein the main line includes one of a data line, a high-potential power line, and an initialization signal line, and
- wherein the auxiliary line includes one of a scan line, a sensing line, a low-potential power line, and a ground voltage line.

18. The electroluminescent display device of claim 16, wherein the main line and the auxiliary line extends to the GIP area and/or the display area through the plurality of dams, and
- wherein the main line passes through lower sides of the plurality of dams in a direction perpendicular to or oblique with respect to an arrangement direction of the plurality of dams, and
- wherein the auxiliary line is provided below the plurality of dams and disposed in a direction parallel to the arrangement direction of the plurality of dams.

19. The electroluminescent display device of claim 1, wherein the planarization layer comprises:
- a first planarization layer disposed on an interlayer insulating layer disposed above the oxide thin-film transistor; and
- a second planarization layer disposed on the first planarization layer.

20. The electroluminescent display device of claim 19, further comprising a hydrogen adsorption layer disposed on the interlayer insulating layer in the plurality of dams.

21. The electroluminescent display device of claim 20, wherein the hydrogen adsorption layer comprises:
- a first hydrogen adsorption layer disposed on the interlayer insulating layer in the plurality of dams; and
- a second hydrogen adsorption layer disposed above the first hydrogen adsorption layer.

22. The electroluminescent display device of claim 21, wherein the hydrogen adsorption layer further comprises a third hydrogen adsorption layer disposed on the first planarization layer in the GIP area.

23. The electroluminescent display device of claim 22, wherein the first, second, and third hydrogen adsorption layers are made of Ti or a Ti alloy.

24. The electroluminescent display device of claim 19, further comprising:
- a first additional line disposed on the interlayer insulating layer in the non-display area; and
- a second additional line disposed on the first planarization layer in the non-display area,
- wherein the first and second additional lines are provided in the plurality of dams and disposed along the plurality of dams, and the first and second additional lines are each any one of a scan line, a sensing line, a low-potential power line, and a ground voltage line, and
- wherein the first and second additional lines extend to the GIP area and/or the display area through the plurality of dams through a jumping structure.

25. The electroluminescent display device of claim 24, wherein the first and second additional lines are made of Ti or a Ti alloy.

26. The electroluminescent display device of claim 25, wherein the trench pattern is not present in a region in which the first and second additional lines are disposed,
- wherein the trench pattern is present in a region in which the first and second additional lines are not disposed, and
- wherein the trench pattern is disposed to surround the display area in a state in which the trench pattern is divided into a plurality of pieces.

* * * * *